(12) United States Patent
Doe et al.

(10) Patent No.: US 10,866,143 B2
(45) Date of Patent: Dec. 15, 2020

(54) INFRARED PHOTODETECTION SYSTEM

(71) Applicants: Sharp Kabushiki Kaisha, Sakai (JP); The University of Tokyo, Tokyo (JP)

(72) Inventors: Takahiro Doe, Sakai (JP); Hirofumi Yoshikawa, Sakai (JP); Tazuko Kitazawa, Sakai (JP); Yasuhiko Arakawa, Tokyo (JP)

(73) Assignees: SHARP KABUSHIKI KAISHA, Sakai (JP); THE UNIVERSITY OF TOKYO, Tokyo (JP)

(*) Notice: Subject to any disclaimer, the term of this patent is extended or adjusted under 35 U.S.C. 154(b) by 131 days.

(21) Appl. No.: 16/367,293

(22) Filed: Mar. 28, 2019

(65) Prior Publication Data

US 2019/0301944 A1 Oct. 3, 2019

(30) Foreign Application Priority Data

Apr. 3, 2018 (JP) .................... 2018-071717

(51) Int. Cl.
| | | |
|---|---|---|
| *G01J 5/10* | (2006.01) | |
| *G01J 3/28* | (2006.01) | |
| *H01L 31/0352* | (2006.01) | |
| *G01J 5/00* | (2006.01) | |

(52) U.S. Cl.
CPC .............. *G01J 5/10* (2013.01); *G01J 3/2803* (2013.01); *H01L 31/035218* (2013.01); *G01J 2005/0077* (2013.01); *G01J 2005/106* (2013.01)

(58) Field of Classification Search
CPC ...... G01J 3/2803; G01J 5/0803; G01J 5/0862; G01J 5/0884; G01J 5/10; G01J 5/602; G01J 2003/2806; G01J 2005/0077; G01J 2005/106; G01J 2005/607; H01L 31/035218; H01L 31/105
See application file for complete search history.

(56) References Cited

U.S. PATENT DOCUMENTS

2004/0108461 A1   6/2004 Mitra

FOREIGN PATENT DOCUMENTS

| JP | 2008-185482 A | 8/2008 |
| JP | 2010-114381 A | 5/2010 |
| JP | 2014-202528 A | 10/2014 |

*Primary Examiner* — Mark R Gaworecki
(74) *Attorney, Agent, or Firm* — Keating & Bennett, LLP

(57) ABSTRACT

An infrared photodetection system is provided that is capable of measuring infrared light up to high-temperature regions while improving a temperature resolution for low-temperature regions without increasing image-acquisition time even if the measuring temperature range varies. The infrared photodetection system is set up to exhibit sensitivity spectrum SSP1 for high sensitivity (for low temperature use) and sensitivity spectrum SSP2 for low sensitivity (for high temperature use) in the transmission band of the bandpass filter when different voltages are applied to a quantum-dot infrared photodetector. The infrared photodetection system then integrates temperature data for the infrared light detected using sensitivity spectrum SSP1 and temperature data for the infrared light detected using sensitivity spectrum SSP2, in order to output a temperature distribution in a measurement region.

11 Claims, 16 Drawing Sheets

(a)

(b)

(a)

(b)

(c)

(d)

(e)

(f)

(g)

(a)

(b)

(a)

(b)

INFRARED PHOTODETECTION SYSTEM

FIELD OF THE INVENTION

The present invention relates to infrared photodetection systems.

BACKGROUND OF THE INVENTION

Japanese Unexamined Patent Application Publication, Tokukai, No. 2010-114381 ("Patent Document 1") describes a photodetector that is capable of detecting a plurality of wavelengths of light. The photodetector includes two $\lambda 1$-sensing elements that sense electromagnetic waves (light) of a wavelength $\lambda 1$ and two $\lambda 2$-sensing elements that sense electromagnetic waves (light) of a wavelength $\lambda 2$. The $\lambda 1$-sensing elements and the $\lambda 2$-sensing elements are arranged in a checkerboard pattern, and each of the elements forms a single pixel.

The $\lambda 1$- and $\lambda 2$-sensing elements each include a diffraction grating and an elliptical QDIP that in turn includes elliptical quantum dots. The grating grooves in the diffraction grating of the $\lambda 1$-sensing element are perpendicular to the grating grooves in the diffraction grating of the $\lambda 2$-sensing element.

The electric field generated by diffraction of infrared light having a wavelength of $\lambda 1$ has a component that is parallel to the major axis of the quantum dot, but substantially no component that is parallel to the minor axis of the quantum dot. In contrast, the electric field generated by diffraction of infrared light having a wavelength of $\lambda 2$ has a component that is parallel to the minor axis of the quantum dot, but substantially no component that is parallel to the major axis of the quantum dot.

In the $\lambda 1$-sensing element, the length of the major axis of the quantum dot is specified such that its sensitivity peaks near the wavelength $\lambda 1$ when the element is struck by infrared light that has an electric field component parallel to the major axis. The period of the grooves in the diffraction grating is specified such that the diffraction angle is approximately equal to 90° when the element is struck by infrared light with the wavelength $\lambda 1$. Consequently, the $\lambda 1$-sensing element generates a strong electric signal (infrared photocurrent or photovoltaic effect) when the element is struck by infrared light having a wavelength of approximately $\lambda 1$, but generates substantially no electric signal when the element is struck by infrared light of other wavelengths.

Meanwhile, in the $\lambda 2$-sensing element, the length of the minor axis of the quantum dot is specified such that its sensitivity peaks near the wavelength $\lambda 2$ when the element is struck by infrared light that has an electric field component parallel to the minor axis. The period of the grooves in the diffraction grating is specified such that the diffraction angle is approximately equal to 90° when the element is struck by infrared light with the wavelength $\lambda 2$. Consequently, the $\lambda 2$-sensing element generates a strong electric signal (infrared photocurrent or photovoltaic effect) when the element is struck by infrared light having a wavelength of approximately $\lambda 2$, but generates substantially no electric signal when the element is struck by infrared light of other wavelengths.

Therefore, the photodetector described in Patent Document 1 is capable of detecting the two wavelengths $\lambda 1$ and $\lambda 2$ of light in a separate manner by means of the $\lambda 1$-sensing elements and the $\lambda 2$-sensing elements.

Japanese Unexamined Patent Application Publication, Tokukai, No. 2014-202528 ("Patent Document 2") describes a temperature measuring instrument. The temperature measuring instrument includes: an imaging means including an array of photoelectric conversion elements that detect the intensity or energy of a beam emitted, for example, from a strand or slab; a data acquisition means configured to acquire a plural sets of imaging data with different exposure times by changing exposure time for the imaging means; a data dividing means configured to divide, into conversion ranges specified for the respective exposure times, pixels corresponding to the array of imaging data acquired by the data acquisition means for different exposure times; a temperature conversion means configured to obtain temperature distributions by converting, in accordance with the exposure times, luminance in the imaging data divided by the data dividing means; and a temperature distribution integration means configured to integrate the temperature distributions obtained by the temperature conversion means to obtain a surface temperature distribution of a high-temperature object.

The temperature measuring instrument described in Patent Document 2 obtains a plurality of images with different exposure times in this manner in order to improve measurement at high temperatures and temperature resolution at low temperatures.

SUMMARY OF THE INVENTION

Problems to be Solved by the Invention

Patent Document 1 requires a plurality of pixels and a design for the elliptical quantum dots because the technology needs to change wavelengths. Meanwhile, Patent Document 2 requires increased image-acquisition time for some measuring temperature ranges because the technology needs to change exposure times.

Accordingly, the present invention, in an embodiment thereof, provides an infrared photodetection system capable of measuring infrared light up to high-temperature regions while improving a temperature resolution for low-temperature regions without increasing image-acquisition time even if the measuring temperature range varies.

Solution to the Problems

Arrangement 1

The present invention, in an embodiment thereof, is directed to an infrared photodetection system including: an infrared photodetection array; a data output means; and an intensity distribution output means. The infrared photodetection array includes a plurality of photoelectric conversion elements that convert infrared light radiated from a target to electric current with a detection sensitivity that varies with an applied voltage. The data output means outputs data based on a radiation intensity detected with different applied voltages being applied to the photoelectric conversion elements. The intensity distribution output means outputs an intensity distribution of the infrared light radiated from the target based on the data outputted by the data output means. The photoelectric conversion elements each have at least first and second states where infrared light absorption spectra determined by the applied voltage differ. The intensity distribution output means outputs the intensity distribution based on sets of data obtained by the photoelectric conversion elements in the first state and the second state respectively.

Arrangement 2

The intensity distribution output means according to arrangement 1 may output the intensity distribution based also on data obtained through detection in a third state in which the photoelectric conversion elements have a detection sensitivity that is intermediate between a detection sensitivity in the first state and a detection sensitivity in the second state.

Arrangement 3

The photoelectric conversion elements according to arrangement 1 or 2 may be adjustable in terms of sensitivity and a center wavelength and full width at half maximum of the infrared light absorption spectra by adjusting an applied voltage for each element.

Arrangement 4

The infrared photodetection system according to any one of arrangements 1 to 3 may further include a conversion unit that converts the intensity distribution outputted by the intensity distribution output means to a temperature distribution.

Arrangement 5

The conversion unit according to arrangement 4 may store therein coefficients of a prescribed function that approximates a sensitivity spectrum of each photoelectric conversion element under an applied voltage.

Arrangement 6

The infrared photodetection system according to any one of arrangements 1 to 5 may further include a display unit that displays the intensity distribution outputted by the intensity distribution output means.

Arrangement 7

The infrared photodetection system according to any one of arrangements 1 to 6 may further include a limiting means that limits a range of wavelengths of infrared light incident to the photoelectric conversion elements. The limiting means controls at least either one of an upper-limit wavelength and a lower-limit wavelength to which the photoelectric conversion elements are sensitive, by controlling the applied voltage.

Arrangement 8

The limiting means according to arrangement 7 may be a bandpass filter, a long-pass filter, a short-pass filter, a spectroscope, or an atmospheric window.

Arrangement 9

The conversion unit according to arrangement 4 or 5 may convert radiation intensity data with a predefined resolution to convert the intensity distribution to a temperature distribution with a prescribed temperature resolution.

Arrangement 10

The conversion unit according to arrangement 4 or 5 may convert the intensity distribution to a temperature distribution by a one-color method (monochromatic method) that calculates temperature by assuming a proper radiation rate for the target.

Arrangement 11

The conversion unit according to arrangement 4 or 5 may convert the intensity distribution to a temperature distribution by a two-color method that calculates temperature by calculating a rate of change of the radiation intensity based on signal outputs from the photoelectric conversion elements under the different applied voltages.

Advantageous Effects of the Invention

The present invention, in an embodiment thereof, enables measuring infrared light up to high-temperature regions while improving a temperature resolution for low-temperature regions without increasing image-acquisition time even if the measuring temperature range varies.

DESCRIPTION OF EMBODIMENTS

Figure 1:
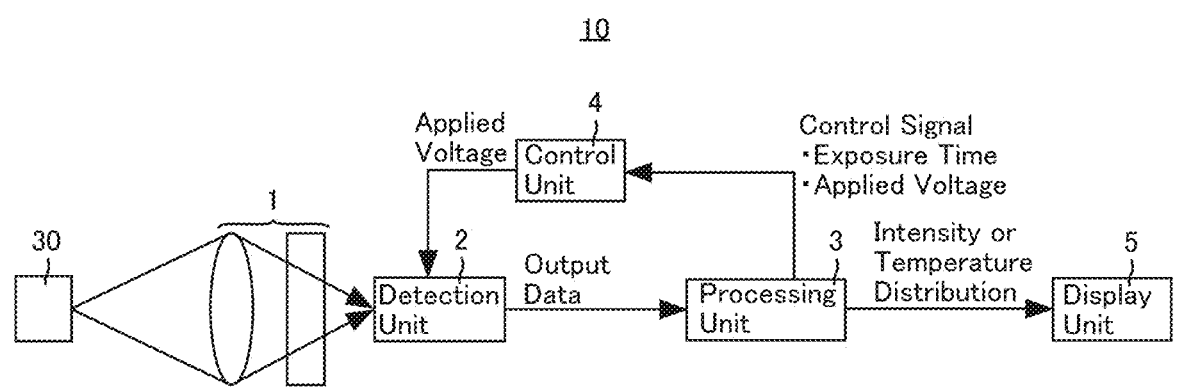
FIG. 1 is a schematic diagram representing an infrared photodetection system in accordance with Embodiment 1 of the present invention.

The following will describe embodiments of the present invention in detail in reference to drawings. Identical or equivalent members will be denoted by the same reference signs in the drawings, and description thereof is not repeated.

A description will be given of some of the terms used in the specification.

A "quantum-dot layer" may include quantum dots, a wetting layer, an intermediate layer, an underlayer for quantum dots, a partial capping layer for quantum dots, an insertion layer, and/or other layers.

"Quantum dots" are small semiconductor particles with particle sizes of 100 nm or less and surrounded by a semiconductor material that has a wider band gap than does the semiconductor material constituting the quantum dots. In Stranski-Krastanov (S-K) growth, a semiconductor material forms a wetting layer before growing into quantum dots.

An "underlayer for quantum dots" provides a base for growth of quantum dots and a wetting layer and is composed of a semiconductor material that has a wider band gap than does the semiconductor material constituting the quantum dots.

A "partial capping layer for quantum dots" is a layer grown over quantum dots and is composed of a semiconductor material that has a wider band gap than does the semiconductor material constituting the quantum dots. The partial capping layer covers at least parts of quantum dots. The partial capping layer is flat in FIG. 2 detailed below and may alternatively be shaped to fit the quantum dots. The partial capping layer in FIG. 2 has a thickness greater than or equal to the height of the quantum dots; alternatively, the thickness may be less than or equal to the height of the quantum dots.

An "intermediate layer" is composed of a semiconductor material that has a wider band gap than does the semiconductor material constituting the quantum dots and provides a base for a quantum-dot layer. The intermediate layer may be composed of the same semiconductor material as the underlayer for quantum dots and the partial capping layer for quantum dots.

Embodiment 1

FIG. 1 is a schematic diagram representing an infrared photodetection system in accordance with Embodiment 1 of the present invention. Referring to FIG. 1, an infrared photodetection system 10 in accordance with Embodiment 1 of the present invention includes an optical system 1, a detection unit 2, a processing unit 3, a control unit 4, and a display unit 5.

A measurement region 30 has large temperature differences therein. For example, there exists a mix of objects approximately at room temperature and objects at or above 100° C. in the measurement region 30.

The optical system 1 includes a lens, a diaphragm (slit), and a bandpass filter. The lens and diaphragm are designed in view of the distance between, and the sizes of, the measurement region 30 and the detection unit 2. The bandpass filter passes only specific wavelengths of light.

The detection unit 2 is built around a quantum-dot infrared photodetector (QDIP) or a quantum-well infrared photodetector (QWIP). The quantum-dot or quantum-well infrared photodetector is in turn built around either a one-dimensional (linear) array of elements or a two-dimensional array of elements. The detection unit 2 detects infrared light in the measurement region 30 under an applied voltage from the control unit 4. The detection unit 2 outputs an analog signal as output data to the processing unit 3. The analog signal is either a voltage or current that varies with the detected radiation intensity of the infrared light.

The processing unit 3 receives the output data from the detection unit 2, amplifies the received output data by a suitable factor, and subsequently converts the amplified data to digital data in an A/D converter. The processing unit 3 then computes intensity distributions in the measurement region 30 on the basis of the digital data. More specifically, the processing unit 3 computes a plurality of intensity distributions on the basis of plural sets of output data obtained through detection performed with different applied voltages being applied to the detection unit 2. Subsequently, the processing unit 3 combines the intensity distributions by a method detailed later and outputs the combined intensity distribution as representing the intensity distribution in the measurement region 30 to the display unit 5.

The processing unit 3 may convert an intensity distribution to a temperature distribution by a one-color method where temperature is calculated by assuming a proper radiation rate for a target object on the basis of Planck's law or by a two-color method where temperature is calculated by calculating a rate of change of radiation intensity.

If the detection unit 2 is built around a one-dimensional array, the processing unit 3 can output a temporal changes of temperature distribution in a two-dimensional manner, as well as a one-dimensional temperature distribution. If the detection unit 2 is built around a two-dimensional array, the processing unit 3 can output a moving image of temporal changes as well as a two-dimensional temperature distribution.

The processing unit 3 also stores a fixed exposure time. The processing unit 3 determines an applied voltage by a method detailed later and outputs a control signal containing the determined applied voltage and the exposure time to the control unit 4.

The control unit 4 receives the control signal from the processing unit 3 and applies that voltage to the detection unit 2 as indicated in the received control signal.

The display unit 5 receives a temperature distribution from the processing unit 3 to display the received temperature distribution together with a temperature scale.

Figure 2:
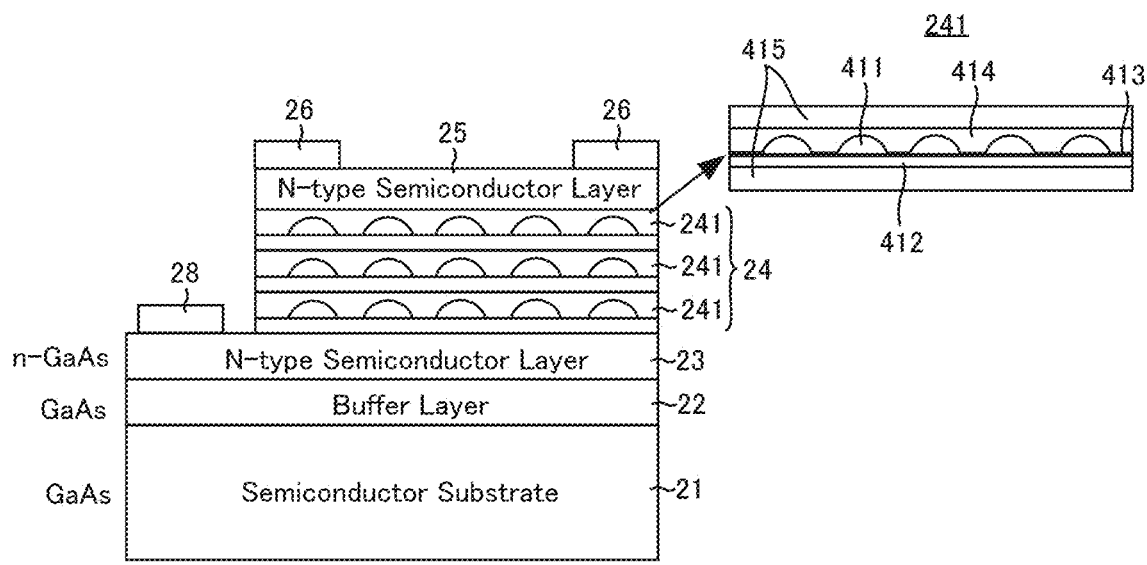
FIG. 2 is a cross-sectional view of a quantum-dot infrared photodetector included in a detection unit shown in FIG. 1.

FIG. 2 is a cross-sectional view of a quantum-dot infrared photodetector included in the detection unit 2 shown in FIG. 1. Referring to FIG. 2, a quantum-dot infrared photodetector 20 includes a semiconductor substrate 21, a buffer layer 22, n-type semiconductor layers 23 and 25, a photoelectric conversion layer 24, and electrodes 26 and 28.

The buffer layer 22 is provided on the semiconductor substrate 21 in contact with one of the faces of the semiconductor substrate 21. The n-type semiconductor layer 23 is provided on the buffer layer 22 in contact with the buffer layer 22.

The photoelectric conversion layer 24 is provided on the n-type semiconductor layer 23 in contact with the n-type semiconductor layer 23. The n-type semiconductor layer 25 is provided on the photoelectric conversion layer 24 in contact with the photoelectric conversion layer 24.

The electrode 26 is shaped like a ring in a plan view and provided on the n-type semiconductor layer 25 in contact with the n-type semiconductor layer 25. The electrode 28 is provided on the n-type semiconductor layer 23 in contact with the n-type semiconductor layer 23.

The semiconductor substrate 21 is composed of, for example, semi-insulating GaAs. The buffer layer 22 is composed of, for example, GaAs and has a thickness of, for example, 100 nm to 500 nm.

The n-type semiconductor layers 23 and 25 are composed of, for example, n-GaAs and have a thickness of, for example, 100 nm to 1000 nm.

The electrodes 26 and 28 are for use with n-type members and composed of, for example, any of Au/AuGeNi, AuGe/Ni/Au, Au/Ge, and Au/Ge/Ni/Au. The electrodes 26 and 28 have a thickness of, for example, 10 nm to 500 nm.

The photoelectric conversion layer 24 has a layered structure including a stack of quantum-dot layers 241. FIG. 2 shows a stack of three quantum-dot layers 241. The quantum-dot infrared photodetector 20 may include a stack of two or more quantum-dot layers 241.

Each quantum-dot layer 241 includes quantum dots 411, an underlayer 412 for the quantum dots 411, a wetting layer 413 for the quantum dots 411, a partial capping layer 414 for the quantum dots 411, and intermediate layers 415.

The underlayer 412 is provided below the quantum dots 411. The wetting layer 413 is provided on the underlayer 412 in contact with the underlayer 412. The intermediate layers 415 are provided on the stack of the quantum dots 411, the underlayer 412, and the wetting layer 413, one on the top of the stock and another on the bottom of the stock, in terms of the stacking direction of the quantum-dot layer 241

The quantum-dot layer 241 may include, for example, an insertion layer as well as the quantum dots 411, the underlayer 412 for the quantum dots 411, the wetting layer 413, the partial capping layer 414 for the quantum dots 411, and the intermediate layers 415.

The quantum-dot layer 241 typically includes at least the quantum dots 411, the underlayer 412 for the quantum dots 411, the partial capping layer 414 for the quantum dots 411, and the intermediate layers 415.

The quantum-dot layer 241 may be composed of any material and is preferably composed of a group III-V compound semiconductor.

The quantum dots 411 are preferably composed of a semiconductor material that has a smaller band gap energy than do the intermediate layers 415.

The quantum-dot layer 241 is preferably composed of, for example, any of $GaAs_xSb_{1-x}$, AlSb, $InAs_xSb_{1-x}$, $Ga_xIn_{1-x}Sb$, $AlSb_xAs_{1-x}$, $AlAs_xSb_{1-x}$, $In_xGa_{1-x}As$, $Al_xGa_{1-x}As$, $Al_yGa_{1-y}As_zSb_{1-z}$, $In_xGa_{1-x}P$, $(Al_yGa_{1-y})_zIn_{1-z}P$, $GaAs_xP_{1-x}$, $Ga_yIn_{1-y}As_zP_{1-z}$, and $In_xAl_{1-x}As$ (throughout the rest of this document, $0 \leq x \leq 1$, $0 \leq y \leq 1$, and $0 \leq z \leq 1$). Alternatively, the quantum-dot layer 241 may be composed of a mixed crystal of these materials.

The quantum-dot layer 241 may be composed of a compound semiconductor of either a group-IV or group-III semiconductor material and a group-V semiconductor material in the periodic table or and may be composed of a compound semiconductor of a group-II and a group-VI semiconductor material. Alternatively, the quantum-dot layer 241 may be composed of a mixed crystal of these materials. The quantum-dot layer 241 may be composed of a chalcopyrite-based material or a non-chalcopyrite semiconductor.

The photoelectric conversion layer 24 may be an i-type semiconductor layer or a semiconductor layer containing a p-type impurity or a n-type impurity.

In an embodiment of the present invention, the photoelectric conversion layer 24 has a quantum-dot layered structure that includes at least the quantum dots 411, the underlayer 412 for the quantum dots 411, the partial capping layer 414 for the quantum dots 411, and the intermediate layers 415. The quantum dots 411, the underlayer 412, the partial capping layer 414, and the intermediate layers 415 are composed of, for example, materials detailed below.

The quantum dots 411 are composed of InAs. The underlayer 412 (may be referred to as the "barrier layer" throughout the rest of this document) is composed of $Al_{0.4}Ga_{0.6}As$. The partial capping layer 414 (may be referred to as the "barrier layer" throughout the rest of this document) is composed of $Al_{0.4}Ga_{0.6}As$. Each intermediate layer 415 is composed of GaAs.

The underlayer 412 and the partial capping layer 414 have such a thickness that electrons can tunnel through the layers.

The intermediate layer 415 is composed of a material with a conduction band that has a lower end close to the first and second excited levels of a conduction band formed in the quantum dots 411 (details will be given later).

The partial capping layer 414 is not necessarily composed of $Al_{0.4}Ga_{0.6}As$ and may be typically composed of $Al_xGa_{1-x}As$ ($0 < x \leq 1$). If the partial capping layer 414 (barrier layer) is composed of AlGaAs, it becomes easier to form, on a GaAs substrate, a partial capping layer 414 (barrier layer) that has a wider band gap than GaAs.

The partial capping layer 414 (barrier layer) may be composed of InGaP or GaAsP.

The intermediate layers 415 are thick and for this reason need to be made of high quality crystals. If the intermediate layer 415 is to be composed of AlGaAs, the crystal quality of the intermediate layer 415 is improved by forming the intermediate layer 415 from GaAs, because the crystal quality improves with a decreasing Al content.

Figure 3:
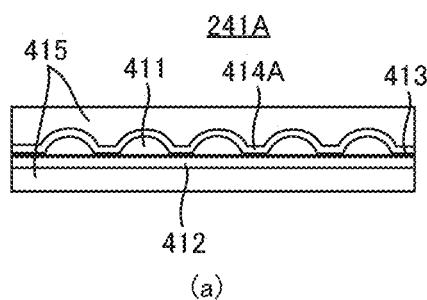
FIG. 3 is a set of cross-sectional views of alternative structures of a quantum-dot layer shown in FIG. 2.
Figure 3:
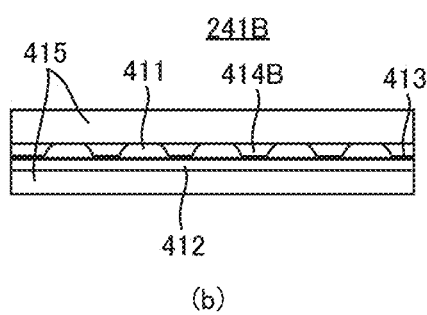

FIG. 3 is a set of cross-sectional views of alternative structures of the quantum-dot layer 241 shown in FIG. 2. The quantum-dot layer 241, in an embodiment of the present invention, may be a quantum-dot layer 241A shown in FIG. 3(a) or a quantum-dot layer 241B shown in FIG. 3(b).

Referring to FIG. 3(a), the quantum-dot layer 241A differs from the quantum-dot layer 241 shown in FIG. 2 where the partial capping layer 414 is replaced by a partial capping layer 414A, and is otherwise the same as the quantum-dot layer 241.

The partial capping layer 414A is provided on the quantum dots 411 and the wetting layer 413 so as to fit the quantum dots 411.

Referring to FIG. 3(b), the quantum-dot layer 241B differs from the quantum-dot layer 241 shown in FIG. 2 where the partial capping layer 414 is replaced by a partial capping layer 414B, and is otherwise the same as the quantum-dot layer 241.

The partial capping layer 414B has the same thickness as the quantum dots 411 and is provided on the quantum dots 411 and the wetting layer 413.

The partial capping layer, in an embodiment of the present invention, may be any of the partial capping layer 414 shown in FIG. 2 and the partial capping layers 414A and 414B shown in FIG. 3.

Figure 4:
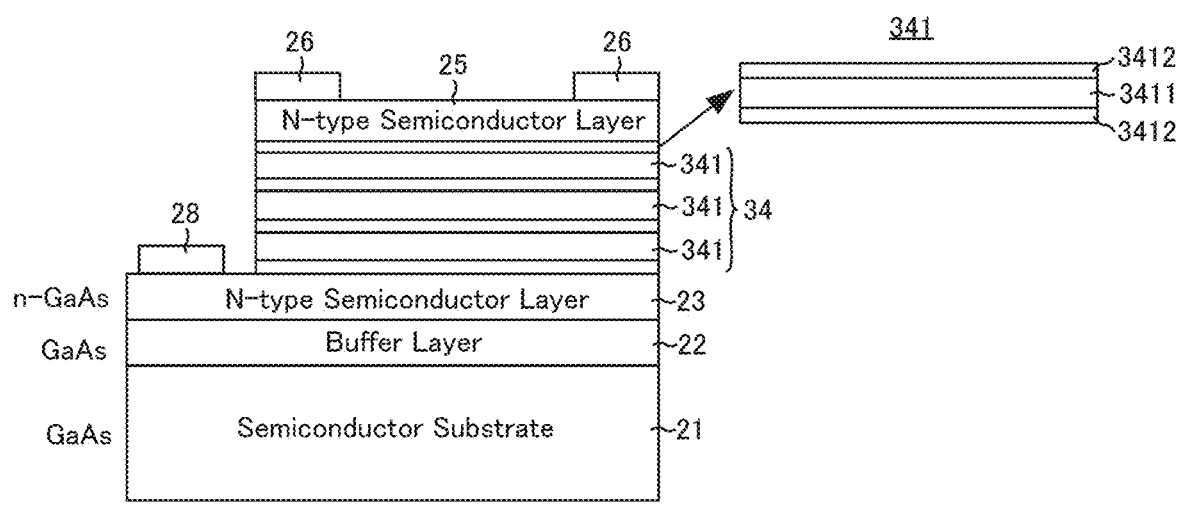
FIG. 4 is a cross-sectional view of a quantum-well infrared photodetector included in the detection unit shown in FIG. 1.

FIG. 4 is a cross-sectional view of a quantum-well infrared photodetector included in the detection unit 2 shown in FIG. 1. Referring to FIG. 4, a quantum-well infrared photodetector 20A differs from the quantum-dot infrared photodetector 20 shown in FIG. 2 where the photoelectric conversion layer 24 is replaced by a photoelectric conversion layer 34, and is otherwise the same as the quantum-dot infrared photodetector 20.

The photoelectric conversion layer 34 is provided between the n-type semiconductor layer 23 and the n-type semiconductor layer 25 in contact with the n-type semiconductor layer 23 and the n-type semiconductor layer 25. The photoelectric conversion layer 34 has a layered structure including a stack of quantum-well layers 341. FIG. 4 shows a stack of three quantum-well layers 341. The quantum-well infrared photodetector 20A may include a stack of two or more quantum-well layers 341.

Each quantum-well layer 341 includes a well layer 3411 and two barrier layers 3412. The well layer 3411 is provided between the two barrier layers 3412 in contact with the two barrier layers 3412. The well layer 3411 has a smaller band gap than do the barrier layers 3412. The quantum-well layer 341 is composed of the same material as the quantum-dot layer 241. The well layer 3411 and the barrier layers 3412 are therefore composed of materials that are selected from $GaAs_xSb_{1-x}$, AlSb, $InAs_xSb_{1-x}$, and other materials listed earlier in such a manner that the well layer 3411 has a smaller band gap than the barrier layers 3412.

The quantum-well layer 341 may be composed of any material and is preferably composed of a group III-V compound semiconductor.

The well layer 3411 and the barrier layer 3412 may have any thickness so long as the well layer 3411 can have a quantum confinement effect on carriers (electrons and holes).

The structure detailed so far of the element exhibits a sensitivity spectrum that shifts in response to a change in applied voltage.

Figure 5:
FIG. 5 is a first set of manufacturing step diagrams representing a method of manufacturing the quantum-dot infrared photodetector shown in FIG. 2.
Figure 5:
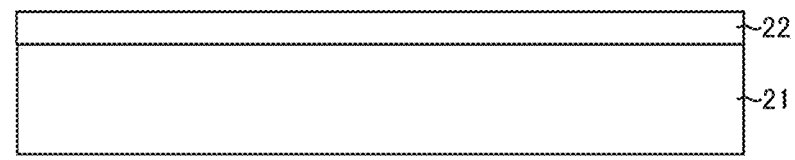
Figure 5:
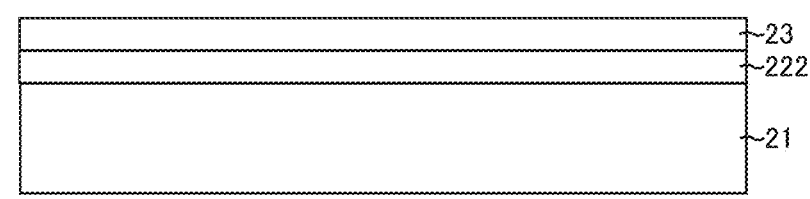
Figure 5:
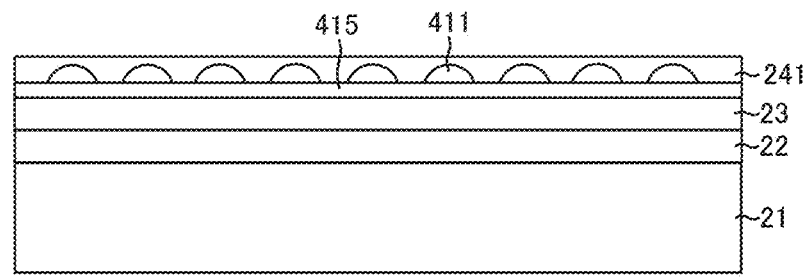
Figure 5:
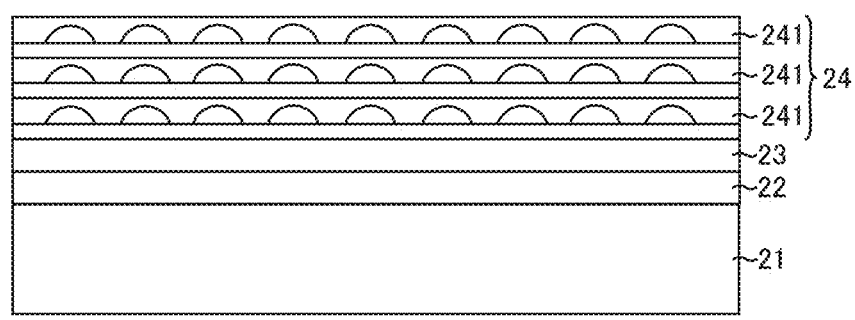
Figure 6:
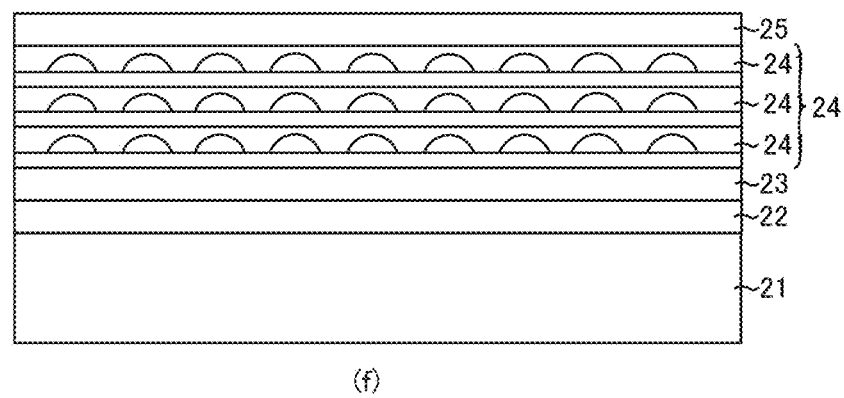
FIG. 6 is a second set of manufacturing step diagrams representing a method of manufacturing the quantum-dot infrared photodetector shown in FIG. 2.
Figure 6:
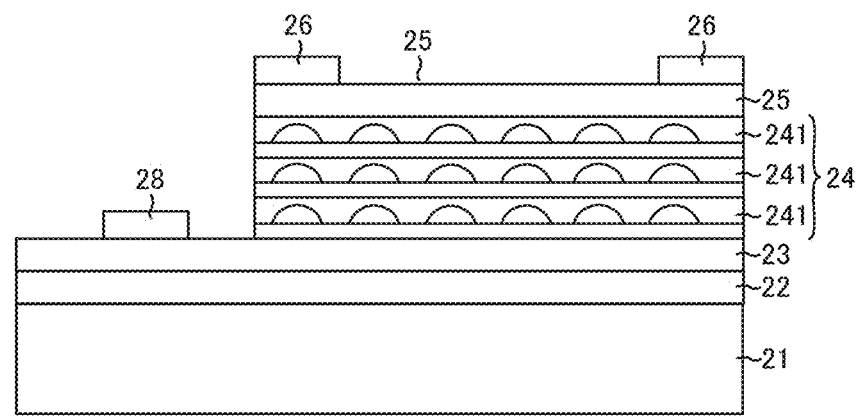

FIGS. 5 and 6 are first and second sets of manufacturing step diagrams, respectively, representing a method of manufacturing the quantum-dot infrared photodetector 20 shown in FIG. 2. Steps (a) to (g) shown in FIGS. 5 and 6 provide a single sequence of manufacturing step diagrams.

Referring to FIG. 5, at the start of the manufacture of the quantum-dot infrared photodetector 20, a semiconductor substrate 1 composed of semi-insulating GaAs is secured in a molecular beam epitaxy (MBE) device (step (a) in FIG. 5).

A buffer layer 22 is then formed on the semiconductor substrate 21 by MBE (step (b) in FIG. 5). More specifically, as an example, a 200-nm thick GaAs layer is formed to serve as a buffer layer 22. The formation of the buffer layer 22 can improve the crystallinity of the photoelectric conversion layer 24 formed on the buffer layer 22, which in turn ensures that the photoelectric conversion layer 24 can exhibit a certain level of light-reception efficiency in the infrared photodetector.

Subsequent to step (b), a n-type semiconductor layer 23 is formed on the buffer layer 22 by MBE (step (c) in FIG. 5). More specifically, as an example, a 500-nm n-GaAs layer is formed to serve as a n-type semiconductor layer 23.

Subsequently, quantum-dot layers 241 each including quantum dots 411 and an intermediate layer 415 are formed on the n-type semiconductor layer 23 by MBE (step (d) in FIG. 5).

The quantum dots 411 here are formed by a method called Stranski-Krastanov (S-K) growth.

More specifically, a GaAs layer is crystalline grown to serve as an intermediate layer 415. Subsequently, an $Al_{0.4}Ga_{0.6}As$ layer is crystalline grown to serve as an underlayer 412 (barrier layer) for the quantum dots 411, and the quantum dots 411 are formed of InAs by a self-assembly mechanism. Subsequently, an $Al_{0.4}Ga_{0.6}As$ layer is crystalline grown to serve as a partial capping layer 414 to embed the quantum dots 411. Furthermore, a GaAs layer is crystalline grown to serve as an intermediate layer in order to form a quantum-dot layer 241.

Step (d) is then repeated, for example, 10 times to form, on the n-type semiconductor layer 23, the photoelectric conversion layer 24 including a stack of quantum-dot layers 241 (step (e) in FIG. 5).

The intermediate layers 415, each having a thickness of 40 nm as an example, are sufficiently thick in comparison with the barrier layers (the underlayer 412 and the partial capping layer 414). The barrier layers (the underlayer 412 and the partial capping layer 414) need to be so thin that excited carriers can tunnel to the intermediate layers 415. Each barrier layer therefore has a thickness of, for example, 1 nm.

Subsequent to step (e) in FIG. 5, a n-type semiconductor layer 25 is formed on the photoelectric conversion layer 24 by MBE (step (f) in FIG. 6). More specifically, as am example, a 200-nm thick n-GaAs layer is crystalline grown to serve as a n-type semiconductor layer 25. This step forms a n-i-n structure.

Subsequently, the laminate is removed from the MBE device. The photoelectric conversion layer 24 and the n-type semiconductor layer 25 are partially etched out by photolithography and wet etching, to form a ring-shaped electrode 26 on the n-type semiconductor layer 25 and an electrode 28 on the n-type semiconductor layer 23. That completes the manufacture of the quantum-dot infrared photodetector 20 (step (g) in FIG. 6).

In these manufacturing steps, as an example, Si may be used as a n-type dopant. The electrodes 26 and 28 are preferably copper and preferably formed by vacuum vapor deposition using resistive heating.

Infrared light, as it enters the quantum-dot infrared photodetector 20, is absorbed by, and excites electrons in, the photoelectric conversion layer 24. The excited electrons are moved by an electric field and extracted to the electrodes 26 and 28 as a photocurrent.

The quantum-well infrared photodetector 20A shown in FIG. 4 can be manufactured in accordance with the same manufacturing step diagrams as those shown in FIGS. 5 and 6, except for steps (d) and (e) being replaced by steps (d') and (e'). Step (d') is a step where a barrier layer 3412 is formed by MBE and a well layer 3411 is formed on the barrier layer 3412 by MBE. Step (e') is a step where step (d') is repeated as many times as the quantum-well layer 341 is stacked. After the last well layer 3411 is formed, another barrier layer 3412 is formed on that well layer 3411. In such a case, steps (a) to (c), (d'), (e'), (f), and (g) provide a single sequence of manufacturing step diagrams.

Infrared light, as it enters the quantum-well infrared photodetector 20A, is absorbed by, and excites electrons in, the photoelectric conversion layer 34. The excited electrons are moved by an electric field and extracted to the electrodes 26 and 28 as a photocurrent.

The detection unit 2 includes a one- or two-dimensional array of quantum-dot infrared photodetectors 20 shown in FIG. 2 or quantum-well infrared photodetectors 20A shown in FIG. 4.

The processing unit 3 and the control unit 4 may be integrated and connected, for example, by attaching, to the detection unit 2, to form a single piece of circuitry.

A description will be now given of a method of measuring a temperature distribution in the measurement region 30 in accordance with an embodiment of the present invention. The following description will focus on a method of measuring a temperature distribution in the measurement region 30 using the quantum-dot infrared photodetector 20 as an example. The same description is however applicable to a method of measuring a temperature distribution in the measurement region 30 using the quantum-well infrared photodetector 20A.

Figure 7:
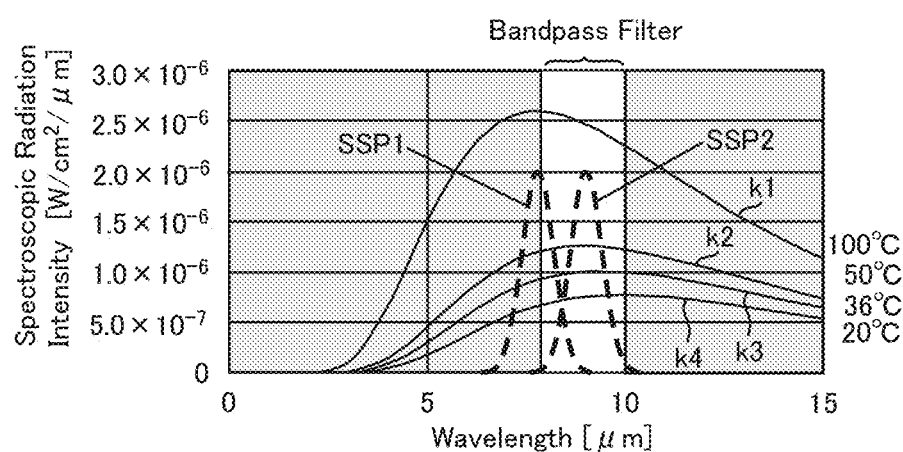
FIG. 7 is a diagram representing a relationship between spectroscopic radiation intensity and wavelength.
Figure 8:
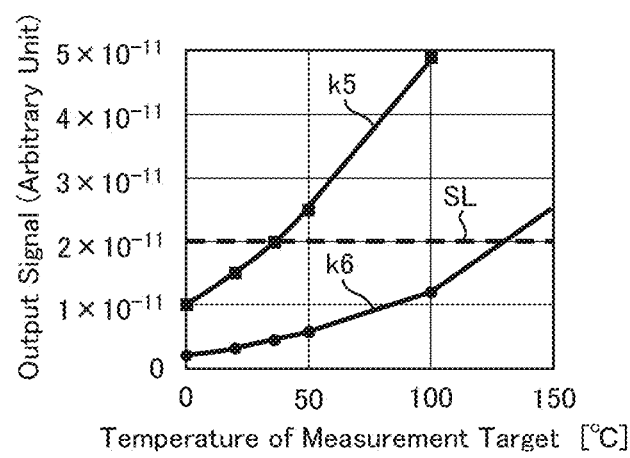
FIG. 8 is a diagram representing a relationship between output signals of the detection unit shown in FIG. 1 and the temperature of a measurement target.

FIG. 7 is a diagram representing a relationship between spectroscopic radiation intensity and wavelength. FIG. 8 is a diagram representing a relationship between output signals of the detection unit 2 shown in FIG. 1 and the temperature of a measurement target. In FIG. 7, the vertical axis shows spectroscopic radiation intensity, and the horizontal axis shows wavelength. Curved lines k1 to k4 represent radiation spectra of an object when the object has a temperature of 100° C., 50° C., 36° C., and 20° C. respectively. SSP1 represents a sensitivity spectrum when the quantum-dot infrared photodetector 20 is placed under an applied voltage of 0.1 V. SSP2 represents a sensitivity spectrum when the quantum-dot infrared photodetector 20 is placed under an applied voltage of 1.0 V.

In FIG. 8, the vertical axis shows output signals, and the horizontal axis shows the temperature of a measurement target. Curved line k5 represents a relationship between output signals and the temperature of a measurement target when the quantum-dot infrared photodetector 20 is placed under an applied voltage of 1.0 V. Curved line k6 represents a relationship between output signals and the temperature of a measurement target when the quantum-dot infrared photodetector 20 is placed under an applied voltage of 0.1 V. Straight line SL represents the upper limit of the range of an A/D converter.

A radiation thermometer detects infrared light radiating from a measurement target and compares radiation intensity in a prescribed transmission band (pass band) with the Planck equation, in order to calculate the temperature of the target.

The QDIP and QWIP have a sensitivity spectrum that shifts with a change in applied voltage (Stark shift). The radiation intensity of the target is measured with different sensitivities by exploiting this phenomenon, to obtain a plurality of results with different temperature-output value relationships.

Referring to FIG. 7, as the voltage applied to the quantum-dot infrared photodetector 20 changes from 0.1 V to 1.0 V, the peak wavelength shifts from 7.8 µm (sensitivity spectrum SSP1) to 9.0 µm (sensitivity spectrum SSP2), provided that the detection sensitivity shows a spectrum that follows a Gaussian distribution (SSP1, SSP2) and has a full width at half maximum (FWHM) of 0.4 µm.

If the radiation spectrum from each temperature region (curved lines k1 to k4) is filtered with a bandpass filter that passes only the wavelengths from the 8.0 µm to 10.0 µm, sensitivity spectrum SSP1, obtained for an applied voltage of 0.1 V, exhibits low radiation intensity in the transmission band of the bandpass filter. The quantum-dot infrared photodetector 20 therefore exhibits low sensitivity and outputs weak signals. In contrast, for an applied voltage of 1.0 V, sensitivity spectrum SSP2 is encompassed by the transmission band of the bandpass filter. The quantum-dot infrared photodetector 20 therefore exhibits high sensitivity and outputs strong signals.

In the processing unit 3, the output signals are amplified by a factor that is suited to the voltage range of the A/D converter and converted to digital temperature data. For this reason, the temperature resolution varies depending on the amplification factor and the number of counts (dynamic range) of the A/D converter.

FIG. 8 represents output signals when temperature is measured with the two sensitivities shown in FIG. 7. As an example, if the amplification factor is set to such a value that the range of the A/D converter has an upper limit of $2 \times 10^{-11}$ and also that the applied voltage is 1.0 V, output signals for approximately 35° C. or higher temperatures saturate, whereas temperature can be calculated with high resolution for 35° C. or lower temperatures (curved line 5).

Meanwhile, if the applied voltage is 0.1 V, temperature can be measured up to approximately 135° C., albeit with a reduced temperature resolution.

These sets of digital data, obtained for different upper-limit temperatures and temperature resolutions, are compared and combined, so that a radiation thermometer can be obtained that exhibits a high temperature resolution for low temperatures and is capable of measurement up to high temperatures.

Figure 9:
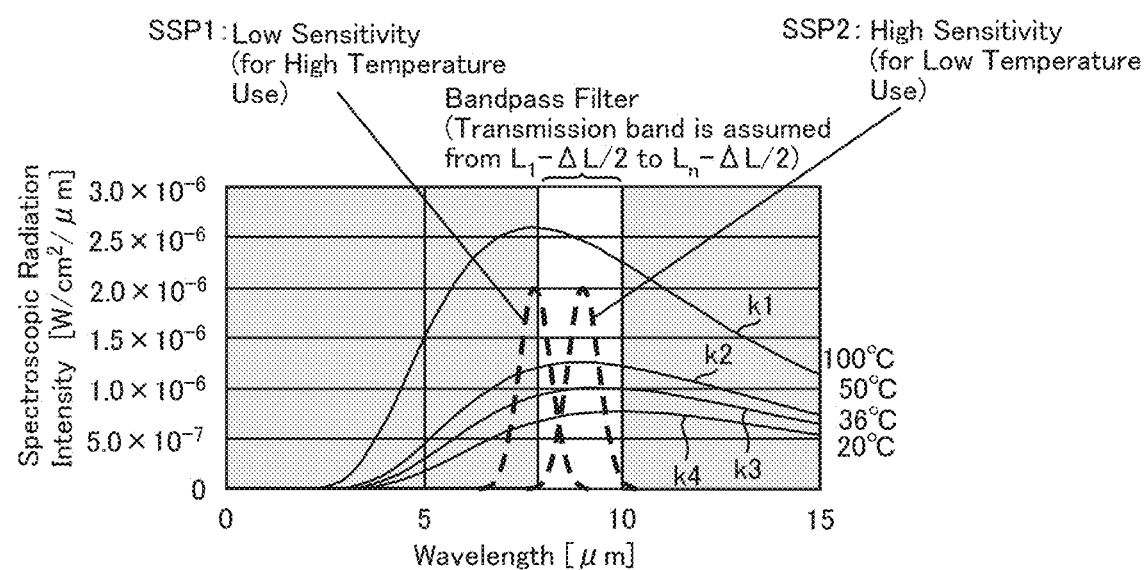
FIG. 9 is a diagram illustrating ranges in which a temperature resolution is improved under applied voltage conditions for high sensitivity and under applied voltage conditions for low sensitivity.

FIG. 9 is a diagram illustrating ranges in which a temperature resolution is improved under applied voltage conditions for high sensitivity and under applied voltage conditions for low sensitivity. FIG. 9 is substantially a reproduction of FIG. 7, but differs where the transmission band for the bandpass filter is changed to range from $L_1 - \Delta L/2$ to $L_n - \Delta L/2$, where n is a positive integer.

$L_1$ and $L_n$ denote wavelengths at which the transmittance of the bandpass filter decreases to half its peak value, $L_1$ and $L_n$ being on the shorter- and longer-wavelength sides of the peak value respectively. $\Delta L$ is a unit wavelength width used to calculate spectroscopic radiation intensity.

The quantum-dot infrared photodetector 20 produces output signals S upon detecting infrared light passing through a prescribed bandpass filter. The output signals S are given by mathematical expression (1).

Math. 1

$$S = \sum_{j=1}^{n} \left[ A \times \exp\left\{ \frac{-(\lambda_j - B)^2}{2C^2} \right\} \times \left\{ \frac{2\pi hc^2}{\lambda_j^5} \frac{\varepsilon}{\left( \exp\frac{hc}{\lambda kT} - 1 \right)} \right\} \frac{d^2}{4L^2} \tau \times \Lambda\lambda \right] \quad (1)$$

In mathematical expression (1), h is Planck's constant; k is Boltzmann's constant; c denotes the speed of light; ε denotes the radiation rate of the measurement target; T denotes the temperature of the measurement target; d denotes the diameter of the measurement target; L denotes the distance between the measurement target and the detection unit 2; τ denotes the transmittance of the bandpass filter; $\Delta L$ denotes a difference between sensitivity spectrum measurement wavelengths; and A, B, and C are the intensity, wavelength, and standard deviation respectively of the sensitivity peak when sensitivity spectra SSP1 and SSP2 are assumed to follow (approximated by) a Gaussian distribution.

The letter $\Sigma$ on the right side of mathematical expression (1) denotes the transmission band of the bandpass filter. In the square brackets on the right side of mathematical expression (1), the first term represents a sensitivity spectrum, the second term represents a radiation intensity (Planck equation), and the third term represents measurement conditions.

The processing unit 3 calculates temperature T on the basis of the output signals S represented by mathematical expression (1). The two output signals S obtained from two sensitivity spectra SSP1 and SSP2 are computed and combined, thereby obtaining the conditions represented by mathematical expression (2) as conditions for improving temperature resolution for low temperatures.

Math. 2

$$\frac{T_{D1,HIGH} - T_{D1,LOW}}{M} < \frac{T_{D2,HIGH} - T_{D2,LOW}}{M} \quad (2)$$

The mathematical expression indicates that the quotient obtained by dividing, by the number of counts M of the A/D converter, a difference, $T_{D1,High} - T_{D1,Low}$, between a temperature $T_{D1,Low}$ in a low-temperature region and a temperature $T_{D1,High}$ in a high-temperature region for high sensitivity conditions (for low temperature use) needs to be smaller than the quotient obtained by dividing, by the number of counts M of the A/D converter, a difference, $T_{D2,High}$–$T_{D2,Low}$, between a temperature $T_{D2,Low}$ in a low-temperature region and a temperature $T_{D2,High}$ in a high-temperature region for low sensitivity conditions (for high temperature use).

Therefore, if the applied voltage and the transmission band of the bandpass filter are set so as to satisfy mathematical expression (2), the temperature resolution can be improved for low-temperature regions while enabling measurement for high-temperature regions.

In mathematical expression (2), the applied voltage for low sensitivity (for high temperature use) takes an optimal value when measurement can be performed in the highest temperature region in the image because conditions need to be satisfied for an optimal temperature resolution and an unsaturated signal and calculated temperature. Meanwhile, the applied voltage for high sensitivity (for low temperature use) takes an optimal value that varies depending on a desired temperature range in which high temperature resolution is needed for low-temperature regions.

The processing unit 3 determines an applied voltage for low sensitivity conditions (for high temperature use) and an applied voltage for high sensitivity conditions (for low temperature use) in such a manner as to satisfy mathematical expression (2).

Sensitivity spectra SSP1 and SSP2 need to be measured on a black body radiation source prepared for the purpose of calibration using a spectroscope and recorded in the processing unit 3 in advance. If all the sensitivity spectra for each applied voltage are recorded, however, the data grows to a huge value. Accordingly, sensitivity spectra SSP1 and SSP2 are approximated by a Gaussian, Lorentz, or other suitable function, and the coefficients of such an approximation function can be recorded in the processing unit 3. This arrangement can alleviate the requirement for a storage capacity in the processing unit 3.

Therefore, the processing unit 3 records the coefficients of a function approximating sensitivity spectra SSP1 and SSP2, reproduces the function approximating sensitivity spectra SSP1 and SSP2 by using the recorded coefficients, and determines an applied voltage for low sensitivity conditions (for high temperature use) and an applied voltage for high sensitivity conditions (for low temperature use) in such a manner as to satisfy mathematical expression (2) by using the reproduced function.

Specific temperature ranges for "high-temperature regions" and "low-temperature regions" are determined in accordance with the highest and lowest output values in an imaged region. An output value (a voltage signal determined by the capacitance of an integrating capacitor as in a CMOS (complementary metal oxide semiconductor)) is determined by a quantity of incident light multiplied by an exposure time. The quantity of incident light is a matter of design choice for the device and increases and decreases depending on the filter and viewing angle used. Therefore, temperature ranges for "high-temperature regions" and "low-temperature regions" are determined in accordance with a difference between the highest and lowest output values determined from the quantity of incident light and the exposure time.

"High sensitivity" and "low sensitivity" are determined by comparing the magnitudes of the integrated values of the products obtained by multiplying the sensitivity spectrum represented by mathematical expression (1) by the transmission spectrum of the bandpass filter.

Figure 10:
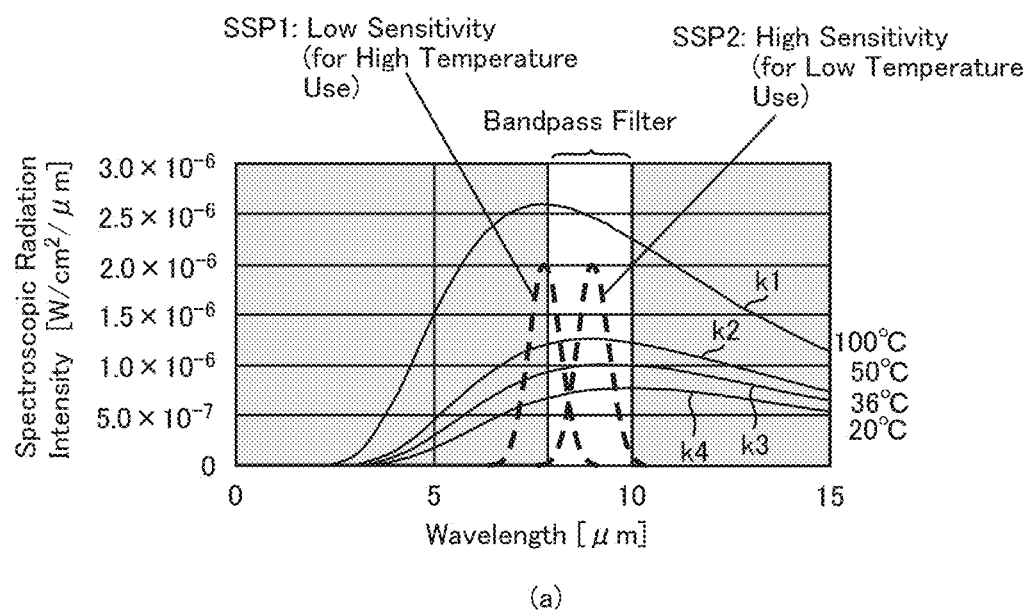
FIG. 10 is a set of diagrams illustrating how to respond to a decrease in sensitivity caused by a change in the voltage applied to a quantum-dot infrared photodetector.
Figure 10:
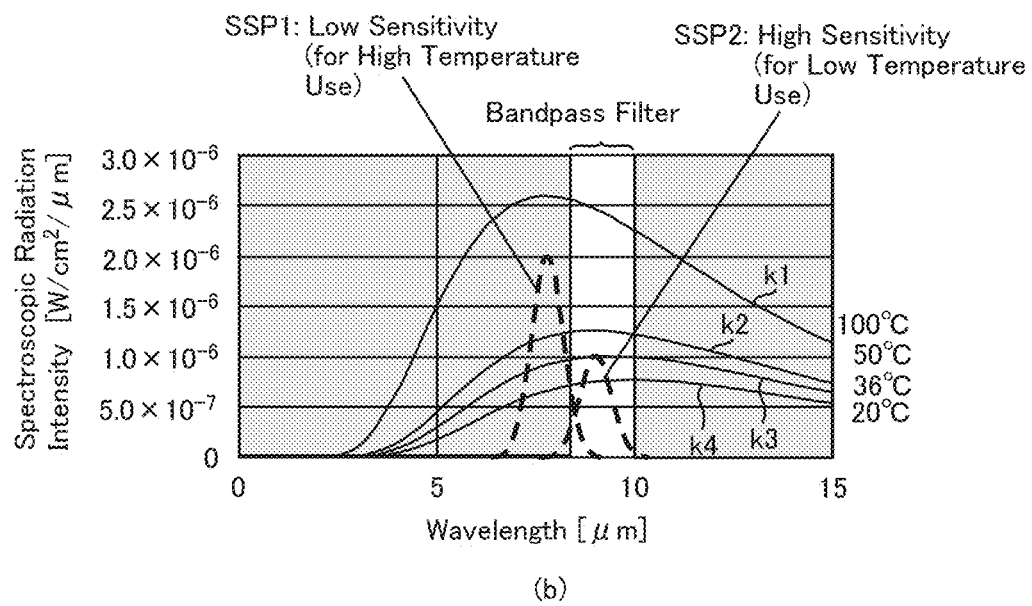

FIG. 10 is a set of diagrams illustrating how to respond to a decrease in sensitivity caused by a change in the voltage applied to the quantum-dot infrared photodetector 20. FIG. 10(a) is a reproduction of FIG. 7. FIG. 10(b) is a reproduction of FIG. 7, except that FIG. 10(b) shows a narrower transmission band for the bandpass filter than FIG. 7.

A change in the applied voltage in the QDIP and QWIP may reduce the absorption factor and lower sensitivity as well as cause a bias shift. When that actually happens, the conditions given by mathematical expression (2) can be satisfied if the transmission band of the bandpass filter is narrowed and the quantum-dot infrared photodetector 20 is controlled to respond to specific wavelengths of infrared light under low sensitivity conditions (see FIG. 10(b)).

Sensitivity spectrum SSP1 for low sensitivity (for high temperature use) shows a narrower transmission band of the bandpass filter in FIG. 10(b) than in FIG. 10(a). Therefore, in FIG. 10(b), the radiation intensity that passes through the transmission band of the bandpass filter decreases. Hence, the quantum-dot infrared photodetector 20 has a low sensitivity and outputs weak signals. When a bias shift occurs as well as sensitivity decreases in this manner, the conditions given by mathematical expression (2) are satisfied by controlling the transmission band of the bandpass filter.

Figure 11:
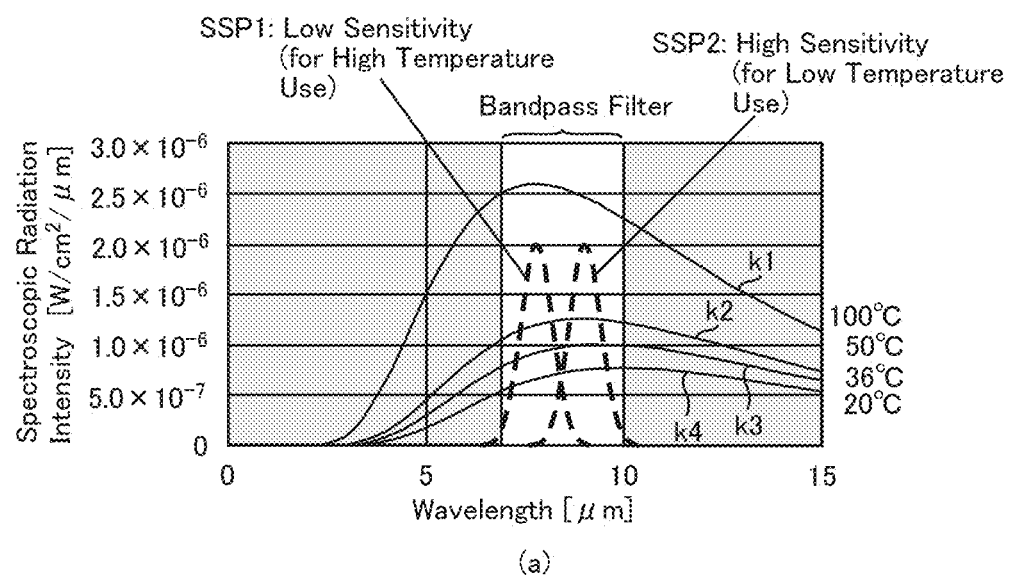
FIG. 11 is a set of diagrams illustrating how to respond to difficulty in narrowing down the transmission band of a bandpass filter.
Figure 11:
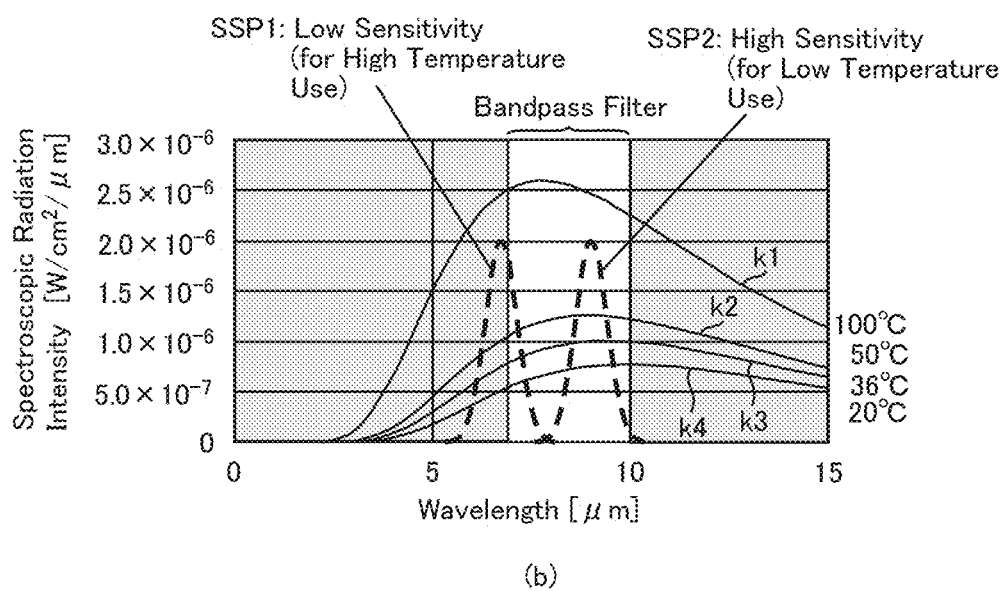

FIG. 11 is a set of diagrams illustrating how to respond to difficulty in narrowing down the transmission band of the bandpass filter. FIG. 11(a) is a reproduction of FIG. 7. FIG. 11(b) is a reproduction of FIG. 7, except that sensitivity spectrum SSP1 in FIG. 7 is replaced by sensitivity spectrum SSP1'.

Some types of bandpass filters may present difficulty in narrowing down their transmission bands due to their compositions and center wavelengths. For such bandpass filters, the conditions given by mathematical expression (2) can be satisfied by adjusting the voltage applied to the QDIP and QWIP in such a manner as to further reduce sensitivity for low sensitivity conditions (see FIG. 11(b)) and to at least maintain and even increase sensitivity for high sensitivity conditions.

The applied voltage for low sensitivity conditions is adjusted so as to obtain sensitivity spectrum SSP1' for low sensitivity (for high temperature use), which is an equivalent of sensitivity spectrum SSP1 for low sensitivity (for high temperature use) shown in FIG. 11(a) that is further shifted toward the shorter wavelength end, as shown in FIG. 11(b). This arrangement further reduces sensitivity for low sensitivity conditions and at least maintains and even increases sensitivity for high sensitivity conditions. That in turn satisfies the conditions given by mathematical expression (2).

Figure 12:
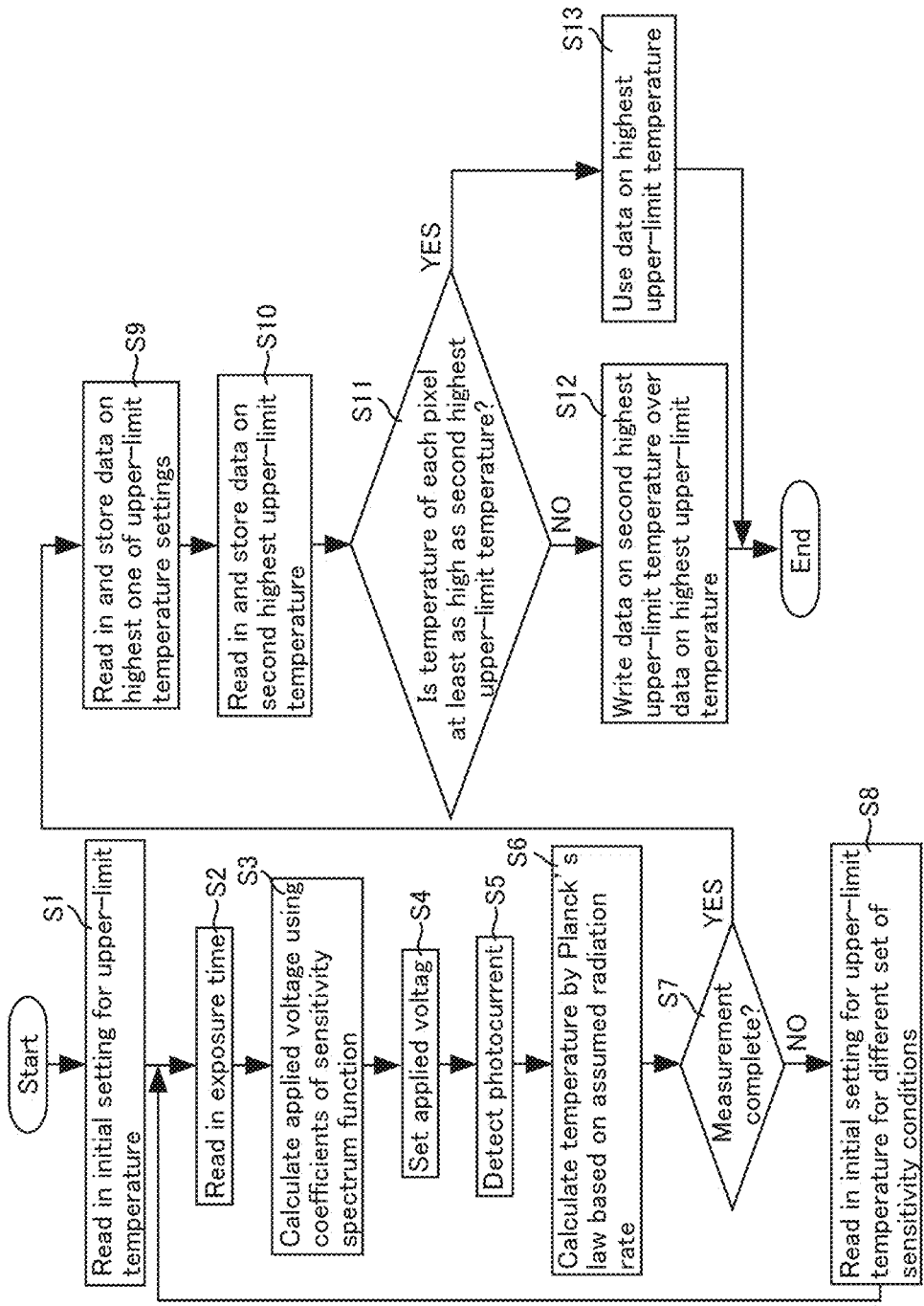
FIG. 12 is a flow chart representing operations of the infrared photodetection system shown in FIG. 1.

FIG. 12 is a flow chart representing operations of the infrared photodetection system 10 shown in FIG. 1. FIG. 12 describes operations of the infrared photodetection system 10 on the assumption that the optical system 1 is equipped with a bandpass filter that has a prescribed transmission band.

Referring to FIG. 12, at the start of the operation of the infrared photodetection system 10, the processing unit 3 reads in an initial setting for the upper-limit temperature (step S1). The processing unit 3 then reads in an exposure time (step S2).

Subsequently, the processing unit 3 calculates the applied voltage by using the coefficients of the sensitivity spectrum function stored therein in advance (step S3). The processing unit 3 then outputs a control signal containing the exposure time and the voltage applied to the control unit 4.

The control unit 4 receives the control signal from the processing unit 3 and sets the voltage applied to the quantum-dot infrared photodetector 20 in the detection unit 2 according to the applied voltage contained in the received control signal (step S4), and controls the quantum-dot infrared photodetector 20 in the detection unit 2 to detect infrared light during the exposure time contained in the control signal.

The quantum-dot infrared photodetector 20 in the detection unit 2 shifts its sensitivity spectrum under the applied voltage specified by the control unit 4, detects a current with the shifted sensitivity spectrum during the exposure time (step S5), and outputs the detected photocurrent to the processing unit 3.

The processing unit 3 receives the photocurrent from the detection unit 2 and calculates temperature from the photocurrent by Planck's law on the basis of an assumed radiation rate (step S6). In this example, the processing unit 3 converts a photocurrent (intensity distribution) to a temperature distribution by a two-color method where temperature is calculated by calculating a rate of change of radiation intensity based on Planck's law from output signals from the quantum-dot infrared photodetector 20 (may be referred to as the "photoelectric conversion elements") under different applied voltages. Alternatively, the processing unit 3 converts a photocurrent (intensity distribution) to a temperature distribution by a one-color method where temperature is calculated by assuming a proper radiation rate for a target object.

Subsequently, the processing unit 3 determines whether or not measurement is completed for all sensitivity conditions in order to determine whether or not measurement is complete (step S7). In doing so, the processing unit 3 determines to terminate measurement if it has determined that measurement is completed for all sensitivity conditions and determines not to terminate measurement if it has determined that measurement is not completed for all sensitivity conditions.

If it is determined in step S7 that measurement is not complete, the processing unit 3 reads in an initial setting for the upper-limit temperature for a different set of sensitivity conditions (step S8). Subsequently, the operation proceeds to step S2, and steps S2 to S8 are repeated until it is determined in step S7 that measurement is complete.

On the other hand, if it is determined in step S7 that measurement is complete, the processing unit 3 reads in and stores data on the highest one of the upper-limit temperature settings (step S9). The processing unit 3 then reads in and stores data on the second highest one of the upper-limit temperature settings (step S10).

The processing unit 3 then determines whether or not the temperature of each pixel is at least as high as the second highest upper-limit temperature (step S11).

If it is determined in step S11 that the temperature of each pixel is not as high as the second highest upper-limit temperature, the processing unit 3 writes the data on the second highest upper-limit temperature over the data on the highest upper-limit temperature (step S12).

On the other hand, if it is determined in step S11 that the temperature of each pixel is higher than or equal to the second highest upper-limit temperature, the processing unit 3 uses the data on the highest upper-limit temperature (step S13). After step S12 or S13, the infrared photodetection system 10 ends operation.

In step S3 in the flow chart in FIG. 12, the processing unit 3 calculates an applied voltage for either set of conditions, low sensitivity conditions (for high temperature use) or high sensitivity conditions (for low temperature use), (e.g., for low sensitivity conditions (for high temperature use)) by using the coefficients of the sensitivity spectrum function. If the infrared photodetection system 10 proceeds to step S3 after steps S8 and S2, the processing unit 3 calculates an applied voltage for the other set of conditions (e.g., for high sensitivity conditions (for low temperature use)) by using the coefficients of the sensitivity spectrum function.

Upon determining in step S7 that measurement is to be terminated, the processing unit 3 possesses digital data on the temperature measured under low sensitivity conditions (for high temperature use) and digital data on the temperature measured under high sensitivity conditions (for low temperature use) (see step S9).

Because the upper-limit temperature in the digital data on the temperature measured under low sensitivity conditions (for high temperature use) is higher than the upper-limit temperature in the digital data on the temperature measured under high sensitivity conditions (for low temperature use), the digital data on the temperature measured under low sensitivity conditions (for high temperature use) is the data on the highest upper-limit temperature, and the digital data on the temperature measured under high sensitivity conditions (for low temperature use) is the data on the second highest upper-limit temperature.

It is determined in step S11 whether or not the temperature of each pixel obtained based on the digital data on the temperature measured under low sensitivity conditions (for high temperature use) is at least as high as the second highest upper-limit temperature. If it is determined that the temperature of each pixel is not as high as the second highest upper-limit temperature, the data on the second highest upper-limit temperature (i.e., the digital data on the temperature measured under high sensitivity conditions (for low temperature use)) is written over the data on the highest upper-limit temperature (i.e., the digital data on the temperature measured under low sensitivity conditions (for high temperature use)) (see step S12). For example, if the highest upper-limit temperature is 1000° C., and the second highest upper-limit temperature is 500° C., the temperature of a pixel indicated as being 500° C. may actually be higher than 500° C. Therefore, the data covering the highest upper-limit temperature of 1000° C. is used. The data for pixels having a temperature below 500° C. (the data on the second highest upper-limit temperature) is written over the data covering the highest upper-limit temperature of 1000° C. (the data on the highest upper-limit temperature). Accordingly, in the overwritten data, the temperature of a pixel indicated as being from 500° C. inclusive to 1000° C. exclusive is the temperature measured under low sensitivity conditions (for high temperature use), and the temperature of a pixel indicated as being below 500° C. is the temperature measured under high sensitivity conditions (for low temperature use).

Therefore, the writing in step S12 of the data on the second highest upper-limit temperature replacing the data on the highest upper-limit temperature corresponds to integration of the data on the highest upper-limit temperature and the data on the second highest upper-limit temperature.

The data covering the highest upper-limit temperature of 1000° C. has a resolution of, for example, 100° C., and the data covering the second highest upper-limit temperature of 500° C. has a resolution of, for example, 50° C., which is smaller than the 100° C. resolution. As a result, the integrated set of data has a better temperature resolution for a low-temperature region than for a high-temperature region. Therefore, the use of the infrared photodetection system 10 in detecting infrared light in the measurement region 30 provides a good temperature resolution for low-temperature regions and enables measurement of infrared light up to high-temperature regions.

The processing unit 3, as described so far, converts radiation intensity data with a predefined resolution of, for example, 100° C. or 50° C., to convert an intensity distribution to a temperature distribution with a prescribed temperature resolution.

Embodiment 2

Figure 13:
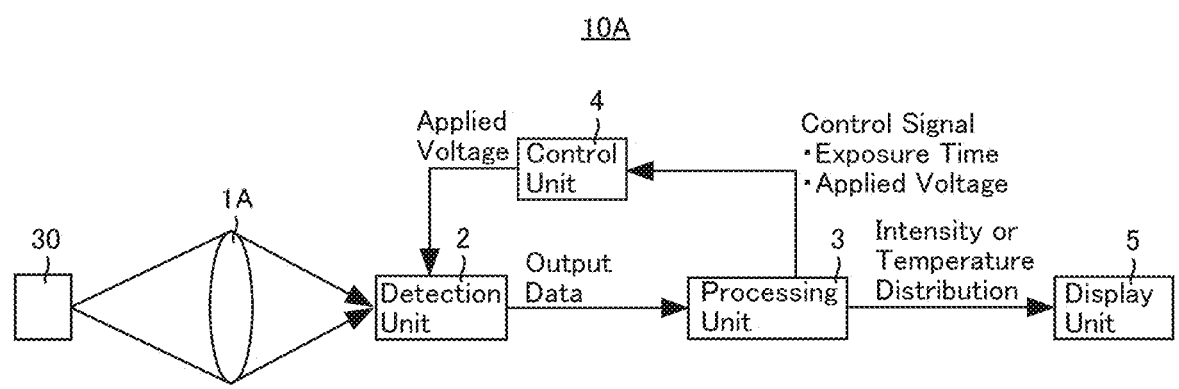
FIG. 13 is a schematic diagram representing an infrared photodetection system in accordance with Embodiment 2.

FIG. 13 is a schematic diagram representing an infrared photodetection system in accordance with Embodiment 2. Referring to FIG. 13, an infrared photodetection system 10A in accordance with Embodiment 2 differs from the infrared photodetection system 10 shown in FIG. 1 where the optical system 1 is replaced by an optical system 1A, and is otherwise the same as the infrared photodetection system 10.

The optical system 1A includes a lens, but no bandpass filter. The detection unit 2 in the infrared photodetection system 10A uses an atmospheric window as a bandpass filter to detect infrared light in the measurement region 30.

Some wavelength regions of infrared light do not pass through the atmosphere as they are absorbed by water vapor and carbon dioxide in the atmosphere. The other wavelengths are termed "atmospheric windows." An atmospheric window may be considered a bandpass filter with fixed transmission bands.

The atmospheric window has a high transmittance for 1.6 to 1.8 µm, 2 to 2.5 µm, 3.4 to 4.2 µm, 4.4 to 5.5 µm, and 8 to 14 µm. Therefore, a bandpass filter is no longer needed if the applied voltage is selected in accordance with the atmospheric window. That can simplify the system and cut costs.

Figure 14:
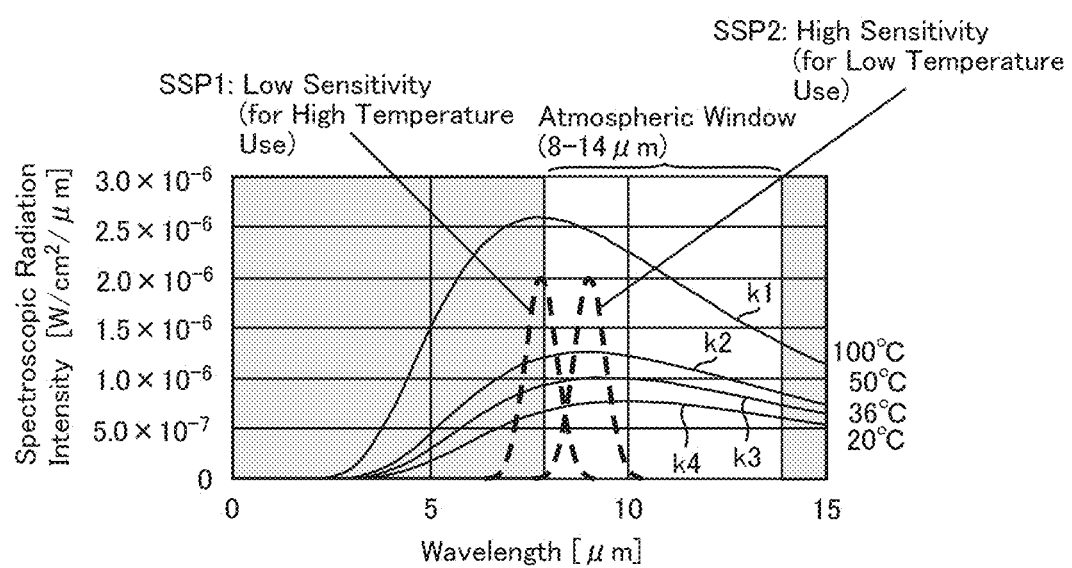
FIG. 14 is a diagram illustrating how infrared light is measured in accordance with Embodiment 2.

FIG. 14 is a diagram illustrating how infrared light is measured in accordance with Embodiment 2. Referring to FIG. 14, by using an atmospheric window (transmission band: 8 to 14 µm) as a bandpass filter, the applied voltage is adjusted in such a manner that the center wavelength for low sensitivity (for high temperature use) falls in an absorption band (5.5 to 8 µm) of the atmosphere. As a result, sensitivity spectrum SSP1 for low sensitivity (for high temperature use) exhibits low radiation intensity in the transmission band of the atmospheric window. The quantum-dot infrared photodetector 20 therefore exhibits low sensitivity and outputs weak signals. In contrast, sensitivity spectrum SSP2 for high sensitivity (for low temperature use) exhibits high radiation intensity in the transmission band of the atmospheric window. The quantum-dot infrared photodetector 20 therefore exhibits high sensitivity and outputs strong signals. Therefore, mathematical expression (2) can be satisfied by an arrangement similar to Embodiment 1.

The infrared photodetection system 10A operates as shown in the flow chart in FIG. 12. In the first execution of step S3, the processing unit 3 calculates, for either set of conditions, low sensitivity conditions (for high temperature use) or high sensitivity conditions (for low temperature use), (e.g., low sensitivity conditions (for high temperature use)) by using the coefficients of the sensitivity spectrum function, such an applied voltage that the center wavelength falls in an absorption band (5.5 to 8 µm) of the atmosphere. If the infrared photodetection system 10A proceeds to step S3 after steps S8 and S2, the processing unit 3 calculates an applied voltage for the other set of conditions (e.g., for high sensitivity conditions (for low temperature use)) by using the coefficients of the sensitivity spectrum function.

The description of Embodiment 1 applies to Embodiment 2 unless otherwise mentioned explicitly.

Embodiment 3

Figure 15:
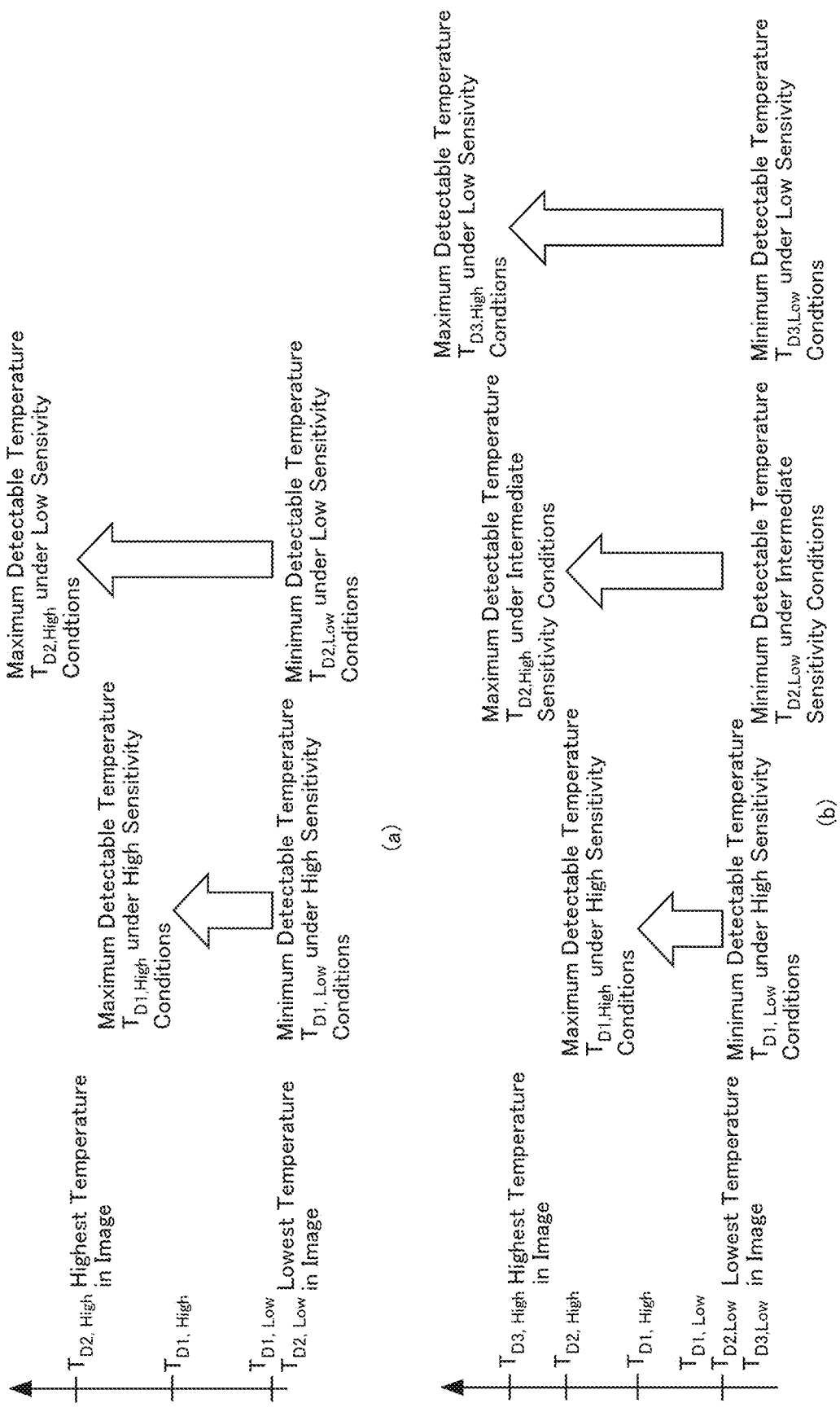
FIG. 15 is a conceptual diagram illustrating sensitivity conditions in accordance with Embodiment 3.

FIG. 15 is a conceptual diagram illustrating sensitivity conditions in accordance with Embodiment 3. As shown in FIG. 15(a), Embodiments 1 and 2 have described that an intensity distribution or a temperature distribution is obtained with a plurality of resolutions by specifying high sensitivity conditions and low sensitivity conditions and determining an applied voltage for the high sensitivity conditions and an applied voltage for the low sensitivity conditions in such a manner as to satisfy mathematical expression (2).

Now, as shown in FIG. 15(b), in Embodiment 3, resolution can be improved for a desired intensity or a temperature region by specifying high sensitivity conditions, intermediate sensitivity conditions, and low sensitivity conditions and determining an applied voltage for the high sensitivity conditions, an applied voltage for the intermediate sensitivity conditions, and an applied voltage for the low sensitivity conditions in such a manner as to satisfy mathematical expression (3).

Math. 3

$$\frac{T_{D1,HIGH} - T_{D1,LOW}}{M} < \frac{T_{D2,HIGH} - T_{D2,LOW}}{M} < \frac{T_{D3,HIGH} - T_{D3,LOW}}{M} \quad (3)$$

In mathematical expression (3), $T_{D3,High} - T_{D3,Low}$ is a difference between a temperature $T_{D3,Low}$ in a low-temperature region and a temperature $T_{D3,High}$ in a high-temperature region for low sensitivity conditions (for high temperature use), and $T_{D2,High} - T_{D2,Low}$ is a difference between a temperature $T_{D2,Low}$ in a low-temperature region and a temperature $T_{D2,High}$ in a high-temperature region for intermediate sensitivity conditions (for intermediate temperature use). See Embodiment 1 for a description of $T_{D1,High} - T_{D1,Low}$.

A specific temperature range for "intermediate temperature" is determined in accordance with a difference between the highest and lowest output values determined from a quantity of incident light and an exposure time as mentioned earlier. "High sensitivity," "intermediate sensitivity," and "low sensitivity" are determined by comparing the magnitudes of the integrated values of the products obtained by multiplying the sensitivity spectrum represented by mathematical expression (1) by the transmission spectrum of the bandpass filter.

Figure 16:
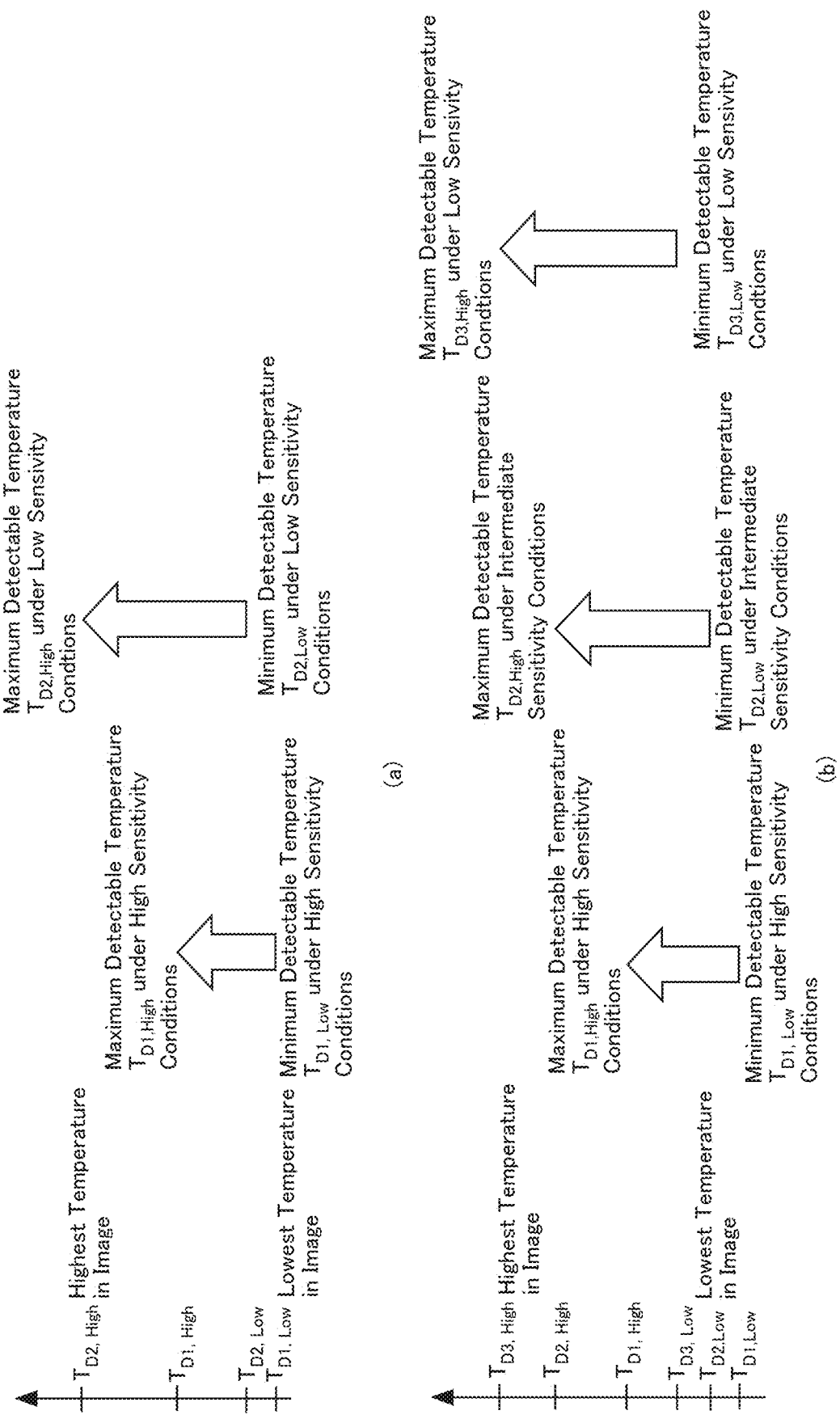
FIG. 16 is a conceptual diagram illustrating sensitivity conditions in accordance with Embodiment 3 when a lower-limit temperature has changed.

FIG. 16 is a conceptual diagram illustrating sensitivity conditions in accordance with Embodiment 3, when a lower-limit temperature has changed. The lower-limit temperature, which is a limit for measurement in a low-temperature region, varies depending on the magnitude of noise under each set of sensitivity conditions. For this reason, $T_{D1,Low}$, $T_{D2,Low}$, and $T_{D3,Low}$ also change, in which case resolution can be improved similarly by determining applied voltages in such a manner as to satisfy mathematical expression (3).

Figure 17:
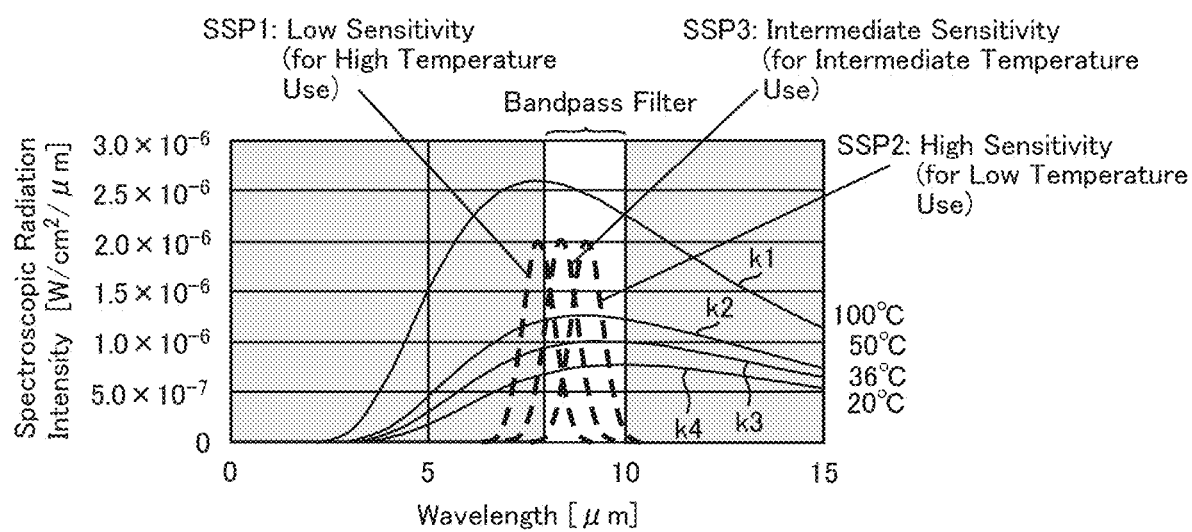
FIG. 17 is a diagram illustrating how infrared light is measured in accordance with Embodiment 3.

FIG. 17 is a diagram illustrating how infrared light is measured in accordance with Embodiment 3. FIG. 17 shows the same relationship between spectroscopic radiation intensity and wavelength as FIG. 7, except for additional sensitivity spectrum SSP3 for intermediate sensitivity (for intermediate temperature use).

Sensitivity spectrum SSP3 is specified between sensitivity spectrum SSP1 and sensitivity spectrum SSP2. Therefore, an applied voltage for high sensitivity conditions, an applied voltage for intermediate sensitivity conditions, and an applied voltage for low sensitivity conditions are determined so as to specify sensitivity spectrum SSP3 between sensitivity spectrum SSP1 and sensitivity spectrum SSP2. This arrangement can improve temperature resolution for each temperature region.

An infrared photodetection system in accordance with Embodiment 3 includes an infrared photodetection system 10 shown in FIG. 1.

Figure 18:
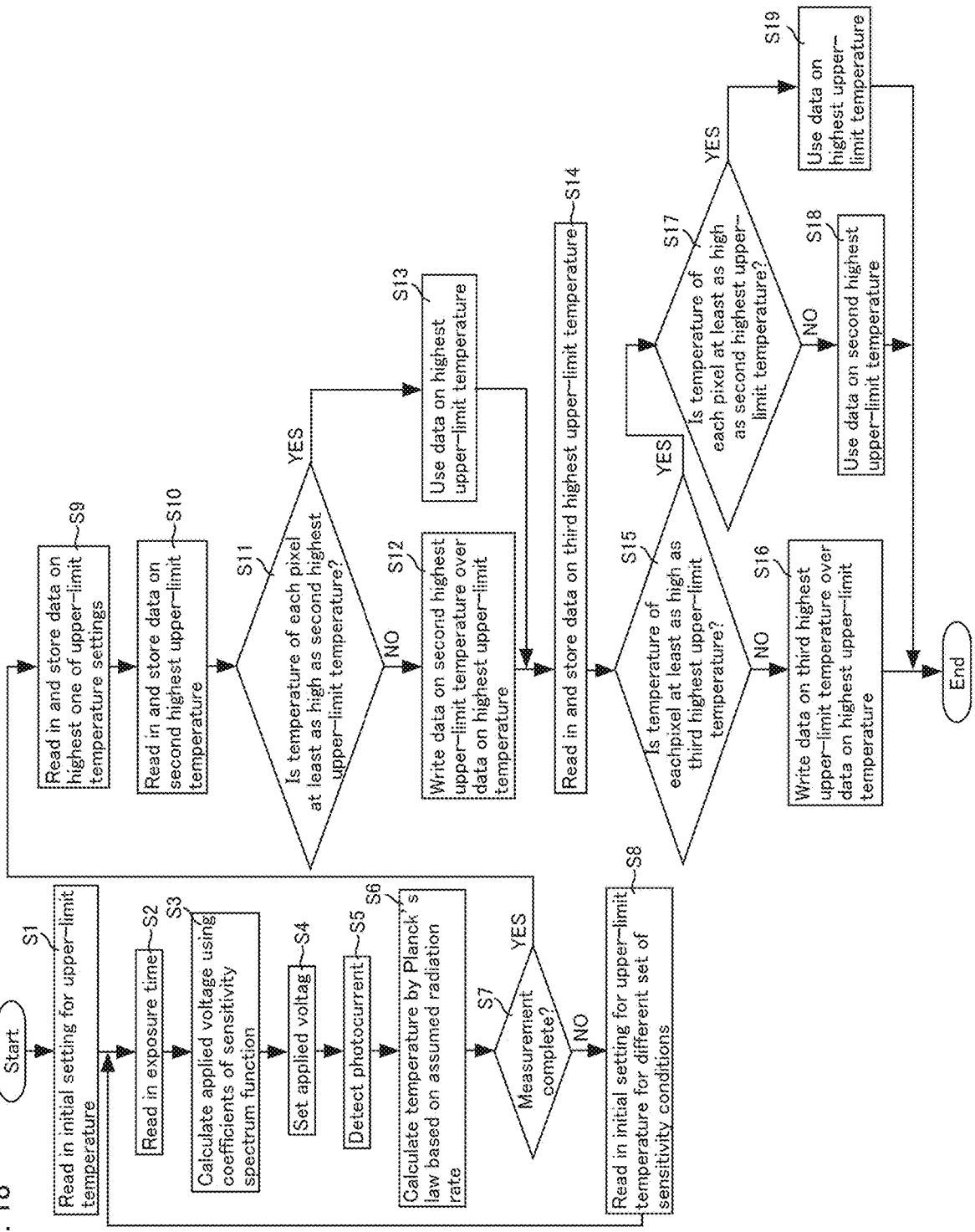
FIG. 18 is a flow chart representing operations of an infrared photodetection system in accordance with Embodiment 3.

FIG. 18 is a flow chart representing operations of the infrared photodetection system 10 in accordance with Embodiment 3.

FIG. 18 is a reproduction of FIG. 12 with additional steps S14 to S19.

At the start of the operation of the infrared photodetection system 10, steps S1 to S13 described above are sequentially executed.

After either step S12 or S13, the processing unit 3 of the infrared photodetection system 10 reads in and stores data on a third highest upper-limit temperature (step S14). The processing unit 3 then determines whether or not the temperature of each pixel is at least as high as the third highest upper-limit temperature (step S15).

If it is determined in step S15 that the temperature of each pixel is not as high as the third highest upper-limit temperature, the processing unit 3 writes the data on the third highest upper-limit temperature over the data on the highest upper-limit temperature (step S16).

On the other hand, if it is determined in step S15 that the temperature of each pixel is higher than or equal to the third highest upper-limit temperature, the processing unit 3 further determines whether or not the temperature of each pixel is at least as high as the second highest upper-limit temperature (step S17).

If it is determined in step S17 that the temperature of each pixel is not as high as the second highest upper-limit temperature, the data on the second highest upper-limit temperature is used (step S18).

On the other hand, if it is determined in step S17 that the temperature of each pixel is higher than or equal to the second highest upper-limit temperature, the data on the highest upper-limit temperature is used (step S19).

Then, after any one of steps S16, S18, and S19, the operation of the infrared photodetection system 10 is terminated.

The processing unit 3, in step S3 in the flow chart shown in FIG. 18, calculates an applied voltage for any set of conditions, low sensitivity conditions (for high temperature use), intermediate sensitivity conditions (for intermediate temperature use), or high sensitivity conditions (for low temperature use), (e.g., low sensitivity conditions (for high temperature use)) by using the coefficients of the sensitivity spectrum function. If the infrared photodetection system 10 executes steps S8 and S2 and proceeds for the second time to step S3, the processing unit 3 calculates an applied voltage for either set (e.g., intermediate sensitivity conditions (for intermediate temperature use)) of the remaining two sets of conditions (e.g., intermediate sensitivity conditions (for intermediate temperature use) and high sensitivity conditions (for low temperature use)) by using the coefficients of the sensitivity spectrum function. If the infrared photodetection system 10 executes steps S8 and S2 and proceeds for the third time to step S3, the processing unit 3 further calculates an applied voltage for the other set (e.g., high sensitivity conditions (for low temperature use)) of the remaining two sets of conditions (e.g., intermediate sensitivity conditions (for intermediate temperature use) and high sensitivity conditions (for low temperature use)) by using the coefficients of the sensitivity spectrum function.

Upon determining in step S7 that measurement is to be terminated, the processing unit 3 possesses digital data on the temperature measured under low sensitivity conditions (for high temperature use), digital data on the temperature measured under intermediate sensitivity conditions (for intermediate temperature use), and digital data on the temperature measured under high sensitivity conditions (for low temperature use) (see step S9).

Because the upper-limit temperature in the digital data on the temperature measured under low sensitivity conditions (for high temperature use) is higher than the upper-limit temperature in the digital data on the temperature measured under intermediate sensitivity conditions (for intermediate temperature use), and the upper-limit temperature in the digital data on the temperature measured under intermediate sensitivity conditions (for intermediate temperature use) is higher than the upper-limit temperature in the digital data on the temperature measured under high sensitivity conditions (for low temperature use), the digital data on the temperature measured under low sensitivity conditions (for high temperature use) is the data on the highest upper-limit temperature, the digital data on the temperature measured under intermediate sensitivity conditions (for intermediate temperature use) is the data on the second highest upper-limit temperature, and the digital data on the temperature measured under high sensitivity conditions (for low temperature use) is the data on the third highest upper-limit temperature.

It is determined in step S11 whether or not the temperature of each pixel obtained based on the digital data on the temperature measured under low sensitivity conditions (for high temperature use) is at least as high as the second highest upper-limit temperature. If it is determined that the temperature of each pixel is not as high as the second highest upper-limit temperature, the data on the second highest upper-limit temperature (i.e., the digital data on the temperature measured under intermediate sensitivity conditions (for intermediate temperature use)) is written over the data on the highest upper-limit temperature (i.e., the digital data on the temperature measured under low sensitivity conditions (for high temperature use)) (see step S12).

If the operation proceeds to step S16 after steps S12 and S14 and "NO" in step S15, the data on the third highest upper-limit temperature is further written over the digital data on the highest upper-limit temperature over which the data on the second highest upper-limit temperature (i.e., the digital data on the temperature measured under intermediate sensitivity conditions (for intermediate temperature use)) has been written.

In other words, the data on the second highest upper-limit temperature (i.e., the digital data on the temperature measured under intermediate sensitivity conditions (for intermediate temperature use)) and the data on the third highest upper-limit temperature (i.e., the digital data on the temperature measured under high sensitivity conditions (for low temperature use)) are written over the data on the highest upper-limit temperature (i.e., the digital data on the temperature measured under low sensitivity conditions (for high temperature use)).

For example, if the highest upper-limit temperature is 1000° C., the second highest upper-limit temperature is 500° C., and the third highest upper-limit temperature is 100° C., the temperature of a pixel indicated as being 500° C. may actually be higher than 500° C. Therefore, the data covering the highest upper-limit temperature of 1000° C. is used. The data for pixels having a temperature below 500° C. (the data on the second highest upper-limit temperature) is written over the data covering the highest upper-limit temperature of 1000° C. (the data on the highest upper-limit temperature). In addition, the temperature of a pixel indicated as being 100° C. may actually be higher than 100° C. Therefore, the data for pixels having a temperature below 100° C. (the data on the third highest upper-limit temperature) is written over the data covering the highest upper-limit temperature of 1000° C. (the data on the highest upper-limit temperature) over which the data for pixels having a temperature below 500° C. (the data on the second highest upper-limit temperature) has been written. Accordingly, in the eventual overwritten data obtained in step S16, the temperature of a pixel indicated as being from 500° C. inclusive to 1000° C. exclusive is the temperature measured under low sensitivity conditions (for high temperature use), the temperature of a pixel indicated as being from 100° C. inclusive to 500° C. exclusive is the temperature measured under intermediate sensitivity conditions (for intermediate temperature use), and the temperature of a pixel indicated as being below 100° C. is the temperature measured under high sensitivity conditions (for low temperature use).

Therefore, the writing in steps S12 and S16 of the data on the second highest upper-limit temperature and the data on the third highest upper-limit temperature replacing the data on the highest upper-limit temperature corresponds to integration of the data on the highest upper-limit temperature, the data on the second highest upper-limit temperature, and the data on the third highest upper-limit temperature.

The data covering the highest upper-limit temperature of 1000° C. has a resolution of, for example, 100° C., the data covering the second highest upper-limit temperature of 500° C. has a resolution of, for example, 50° C., which is smaller than the 100° C. resolution, and the data on the third highest upper-limit temperature has a resolution of, for example, 10° C., which is smaller the 50° C. resolution. As a result, the integrated set of data has a better temperature resolution for a low-temperature region than for an intermediate temperature region and a better temperature resolution for an intermediate temperature region than for a high-temperature region. Therefore, the use of the infrared photodetection system 10 in detecting infrared light in the measurement region 30 provides a better temperature resolution for low-temperature regions than Embodiments 1 and 2 and enables measurement up to high-temperature regions.

On the other hand, if the operation proceeds to step S18 after steps S12 and S14, "YES" in step S15, and "NO" in step S17 in the flow chart shown in FIG. 18, the data on the second highest upper-limit temperature is used.

Meanwhile, if the operation proceeds to step S19 after steps S12 and S14, "YES" in step S15, and "YES" in step S17 in the flow chart shown in FIG. 18, the data on the highest upper-limit temperature is used.

Furthermore, if the operation proceeds to step S16 after steps S13 and S14, and "NO" in step S15 in the flow chart shown in FIG. 18, the data on the highest upper-limit temperature is used over which the data on the third highest upper-limit temperature has been written.

Furthermore, if the operation proceeds to step S18 after steps S13 and S14, "YES" in step S15, and "NO" in step S17 in the flow chart shown in FIG. 18, the data on the second highest upper-limit temperature is used.

Furthermore, if the operation proceeds to step S19 after steps S13 and S14, "YES" in step S15, and "YES" in step S17 in the flow chart shown in FIG. 18, the data on the highest upper-limit temperature is used.

This detection of infrared light in the measurement region 30 using low sensitivity conditions (for high temperature use), intermediate sensitivity conditions (for intermediate temperature use), and high sensitivity conditions (for low temperature use) provides a better temperature resolution for low-temperature regions than Embodiments 1 and 2 and enables temperature measurement up to high-temperature regions.

Alternatively, the infrared photodetection system 10A shown in FIG. 13 may be used in Embodiment 3 to detect infrared light under low sensitivity conditions (for high temperature use), intermediate sensitivity conditions (for intermediate temperature use), and high sensitivity conditions (for low temperature use). In such a case, sensitivity spectra SSP1, SSP2, and SSP3 are specified in the transmission band of the atmospheric window in the same manner as in FIG. 17. The infrared photodetection system 10A in accordance with Embodiment 3 operates following the flow chart shown in FIG. 18 described earlier.

The present invention has been described so far as determining an applied voltage for high sensitivity conditions (for low temperature use) and an applied voltage for low sensitivity conditions (for high temperature use) using mathematical expression (2) or determining an applied voltage for high sensitivity conditions (for low temperature use), an applied voltage for intermediate sensitivity conditions (for intermediate temperature use), and an applied voltage for low sensitivity conditions (for high temperature use) using mathematical expression (3). Alternatively, in an embodiment of the present invention, mathematical expression (4) may be used to determine an applied voltage for high sensitivity conditions (for low temperature use) and an applied voltage for low sensitivity conditions (for high temperature use), or mathematical expression (5) may be used to determine an applied voltage for high sensitivity conditions (for low temperature use), an applied voltage for intermediate sensitivity conditions (for intermediate temperature use), and an applied voltage for low sensitivity conditions (for high temperature use).

Math. 4

$$\frac{S_{D1,HIGH} - S_{D1,LOW}}{M} < \frac{S_{D2,HIGH} - S_{D2,LOW}}{M} \quad (4)$$

Math. 5

$$\frac{S_{D1,HIGH} - S_{D1,LOW}}{M} < \frac{S_{D2,HIGH} - S_{D2,LOW}}{M} < \frac{S_{D3,HIGH} - S_{D3,LOW}}{M} \quad (5)$$

In mathematical expression (4), $S_{D1,High} - S_{D1,Low}$ is a difference between an output signal $S_{D1,Low}$ for a low-temperature region and an output signal $S_{D1,High}$ for a high-temperature region, both for high sensitivity conditions (for low temperature use), and $S_{D2,High} - S_{D2,Low}$ is a difference between an output signal $S_{D2,Low}$ for a low-temperature region and an output signal $S_{D2,High}$ for a high-temperature region, both for low sensitivity conditions (for high temperature use).

In mathematical expression (5), $S_{D3,High} - S_{D3,Low}$ is a difference between an output signal $S_{D3,Low}$ for a low-temperature region and an output signal $S_{D3,High}$ for a high-temperature region, both for low sensitivity conditions (for high temperature use), and $S_{D2,High} - S_{D2,Low}$ is a difference between an output signal $S_{D2,Low}$ for a low-temperature region and an output signal $S_{D2,High}$ for a high-temperature region, both for intermediate sensitivity conditions (for intermediate temperature use). $S_{D1,High} - S_{D1,Low}$ is defined as described earlier in relation to mathematical expression (4).

D* ("dee-star"), a frequently used performance index for infrared photodetectors, is used in relation to mathematical expressions (4) and (5) in order to define a resolution by considering sensor area and noise properties as well as sensor sensitivity and specify an applied voltage using a voltage signal S.

D* is a performance index for calculating the incident intensity P for S/N=1 (the incident intensity that serves as a detect limitation) and is given by $(S/N)*\Delta f^{(1/2)}/(P \cdot Sa^{(1/2)})$ and normalized by a ratio S/N (voltage signal/noise voltage), sensor area Sa, and noise measurement band width $\Delta f$. Therefore, the voltage signal S is given by $D^* \times P \times Sa^{(1/2)} \times N/\Delta f^{(1/2)}$.

The infrared photodetection systems 10 and 10A have been described so far as detecting infrared light using high sensitivity conditions (for low temperature use) and low sensitivity conditions (for high temperature use) or detecting infrared light using high sensitivity conditions (for low temperature use), intermediate sensitivity conditions (for intermediate temperature use), and low sensitivity conditions (for high temperature use). Alternatively, in an embodiment of the present invention, the infrared photodetection systems 10 and 10A may detect infrared light using four or more sets of sensitivity conditions and may generally detect infrared light using a plural sets of sensitivity conditions.

According to Embodiments 1 to 3 described above, an infrared photodetection system in accordance with an embodiment of the present invention may include: an infrared photodetection array including a plurality of photoelectric conversion elements configured to convert infrared light radiated from a target to electric current with a detection sensitivity that varies with an applied voltage; a data output means configured to output data based on a radiation intensity detected with different applied voltages being applied to the photoelectric conversion elements; and an intensity distribution output means configured to output an intensity distribution of the infrared light radiated from the target based on the data outputted by the data output means, wherein: the photoelectric conversion elements each have at least a first state and a second state both determined by the applied voltage; and the intensity distribution output means outputs the intensity distribution based on sets of data obtained through detection by the photoelectric conversion elements in the first state and the second state respectively.

The embodiments and examples disclosed herein are for illustrative purposes only in every respect and provide no basis for restrictive interpretations. The scope of the present invention is defined only by the claims and never bound by the embodiments or examples. Those modifications and variations that may lead to equivalents of claimed elements are all included within the scope of the invention.

INDUSTRIAL APPLICABILITY

The present invention is applicable to infrared photodetection systems.

REFERENCE SIGNS LIST 1, 1A Optical System
2 Detection Unit
3 Processing Unit
4 Control Unit
5 Display Unit
10, 10A Infrared Photodetection System
21 Semiconductor Substrate
22 Buffer Layer
23, 25 N-type Semiconductor Layer
24, 34 Photoelectric conversion Layer
26, 28 Electrode
20 Quantum-dot Infrared Photodetector
20A Quantum-well Infrared Photodetector
30 Measurement region
241, 241A, 241B Quantum-dot Layer
341 Quantum-well Layer
411 Quantum Dot
412 Underlayer
413 Wetting Layer
414 Partial Capping Layer
415 Intermediate Layer
3411 Well Layer
3412 Barrier Layer

What is claimed is:

1. An infrared photodetection system comprising:
an infrared photodetection array including a plurality of photoelectric conversion elements configured to convert infrared light radiated from a target to electric current with a detection sensitivity that varies with an applied voltage;
a data output means configured to output data based on a radiation intensity detected with different applied voltages being applied to the photoelectric conversion elements; and
an intensity distribution output means configured to output an intensity distribution of the infrared light radiated from the target based on the data outputted by the data output means,
wherein:
the photoelectric conversion elements each have at least first and second states where infrared light absorption spectra determined by the applied voltage differ; and
the intensity distribution output means outputs the intensity distribution based on sets of data obtained by the photoelectric conversion elements in the first state and the second state respectively.

2. The infrared photodetection system according to claim 1, wherein the intensity distribution output means outputs the intensity distribution based also on data obtained through detection in a third state in which the photoelectric conversion elements have a detection sensitivity that is intermediate between a detection sensitivity in the first state and a detection sensitivity in the second state.

3. The infrared photodetection system according to claim 1, wherein the photoelectric conversion elements are adjustable in terms of sensitivity and a center wavelength and full width at half maximum of the infrared light absorption spectra by adjusting an applied voltage for each element.

4. The infrared photodetection system according to claim 1, further comprising a conversion unit configured to convert the intensity distribution outputted by the intensity distribution output means to a temperature distribution.

5. The infrared photodetection system according to claim 4, wherein the conversion unit stores therein coefficients of a prescribed function that approximates a sensitivity spectrum of each photoelectric conversion element under an applied voltage.

6. The infrared photodetection system according to claim 4, wherein the conversion unit converts radiation intensity data with a predefined resolution to convert the intensity distribution to a temperature distribution with a prescribed temperature resolution.

7. The infrared photodetection system according to claim 4, wherein the conversion unit converts the intensity distribution to a temperature distribution by a one-color method that calculates temperature by assuming a proper radiation rate for the target.

8. The infrared photodetection system according to claim 4, wherein the conversion unit converts the intensity distribution to a temperature distribution by a two-color method that calculates temperature by calculating a rate of change of the radiation intensity based on signal outputs from the photoelectric conversion elements under the different applied voltages.

9. The infrared photodetection system according to claim 1, further comprising a display unit configured to display the intensity distribution outputted by the intensity distribution output means.

10. The infrared photodetection system according to claim 1, further comprising a limiting means configured to limit a range of wavelengths of infrared light incident to the photoelectric conversion elements, wherein the limiting means controls at least either one of an upper-limit wavelength and a lower-limit wavelength to which the photoelectric conversion elements are sensitive, by controlling the applied voltage.

11. The infrared photodetection system according to claim 10, wherein the limiting means is a bandpass filter, a long-pass filter, a short-pass filter, a spectroscope, or an atmospheric window.

* * * * *